(12) United States Patent
Taguchi et al.

(10) Patent No.: US 6,438,055 B1
(45) Date of Patent: Aug. 20, 2002

(54) DYNAMIC MEMORY CIRCUIT WITH AUTOMATIC REFRESH FUNCTION

(75) Inventors: Masao Taguchi; Yasurou Matsuzaki, both of Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/688,941

(22) Filed: Oct. 17, 2000

(30) Foreign Application Priority Data

Oct. 20, 1999 (JP) .......................................... 11-298354

(51) Int. Cl.$^7$ ................................................ G11C 7/00
(52) U.S. Cl. ..................................................... 365/222
(58) Field of Search ........................... 365/222, 230.03, 365/230.06, 149

(56) References Cited

U.S. PATENT DOCUMENTS

| | | | | |
|---|---|---|---|---|
| 5,636,173 A | * | 6/1997 | Schaefer | 365/230.03 |
| 5,659,515 A | | 8/1997 | Matsuo et al. | 365/222 |
| 5,818,777 A | * | 10/1998 | Seyyedy | 365/222 |
| 5,875,452 A | | 2/1999 | Katayama et al. | 711/105 |
| 6,075,740 A | | 6/2000 | Leung | 365/222 |
| 6,208,577 B1 | * | 3/2001 | Muularkey | 365/222 |

FOREIGN PATENT DOCUMENTS

JP 61-71494 4/1986

* cited by examiner

Primary Examiner—Michael S. Lebentritt
Assistant Examiner—Anh Phung
(74) Attorney, Agent, or Firm—Arent Fox Kintner Plotkin & Kahn, PLLC

(57) ABSTRACT

The present invention is that in a dynamic memory circuit, first and second internal operation cycles are assigned to one external operation cycle according to external commands, a memory core performs a read operation which corresponds to a read command at the first internal operation, and performs a refresh operation which responds to a refresh command at the second internal operation cycle. Also the memory core performs a refresh operation which responds to a refresh command at the first internal operation cycle, and performs a write operation which corresponds to a write command at the second internal operation cycle. It is preferable that when the read or write command is not input, the refresh operation is performed at the earlier internal operation cycle. And a refresh command generation circuit which generates the refresh command at a refresh time is created in the memory circuit.

9 Claims, 24 Drawing Sheets

First Embodiment

FIG. 2 First Embodiment

FIG. 6 Second Embodiment

FIG. 7 Second Embodiment

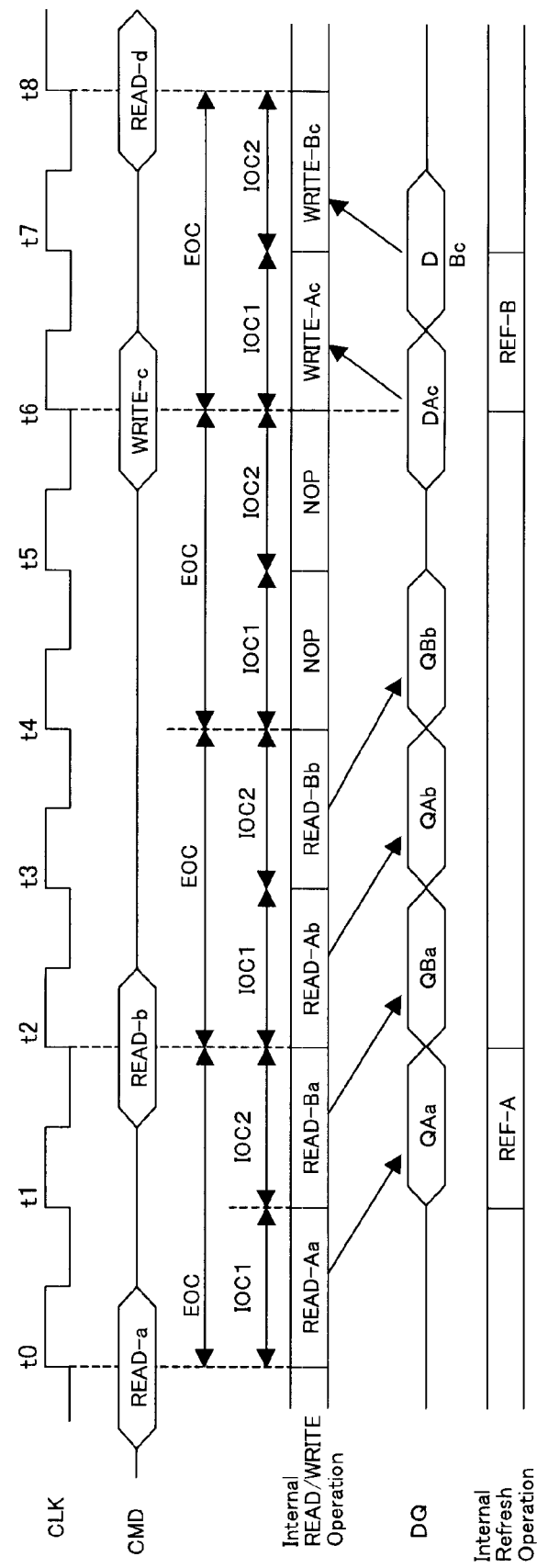
FIG. 15 Fifth Embodiment

DYNAMIC MEMORY CIRCUIT WITH AUTOMATIC REFRESH FUNCTION

BACKGROUND OF THE INVENTION

1. Field of the Invention

The present invention relates to a memory circuit which requires a refresh operation for maintaining stored data, such as a dynamic RAM (DRAM), and more particularly to a dynamic memory circuit which automatically performs a refresh without requiring a refresh instruction from outside.

2. Description of the Related Art

A DRAM, which is widely used as a large capacity memory device, uses a volatile memory cell which consists of one transistor and one capacitor, so a periodic refresh is necessary to maintain stored data.

Generally speaking, refresh is classified into auto refresh, which is performed by responding to an external command in normal mode, and self refresh, which the memory device automatically performs in power down mode.

Before describing refresh, a configuration of a conventional synchronous type dynamic memory circuit will be described. FIG. 24 shows a configuration of a conventional synchronous type dynamic memory circuit. The memory circuit shown in FIG. 24 comprises two memory banks BANK0 and BANK1, which are the memory core. The peripheral circuits shared by these memory banks are, a clock input buffer 10 which inputs a clock CLK from outside according to the state of a clock enable signal CKE and supplies an internal clock CLK1 to internal blocks, a command decoder 12 which latches a command input CMD from outside and decodes it, an address buffer 14 which latches an address from outside, a data input/output buffer register 16 which outputs or inputs data to the data input/output terminal DQ, a self refresh control part 18 which generates an internal self refresh signal S-REF1 responding to a self refresh command S-REF, and a refresh address counter 22.

In each memory bank, a plurality of blocks BLK which have a memory cell array MC, a row decoder RDEC and a sense amplifier SA and a column decoder CDEC respectively, a command latch 24 shared by the blocks BLK, a control circuit 26 which supplies control signals corresponding to the block responding to various commands RD, WR and REF from the command latch 24, and a selector 28 which selects either a refresh address from the refresh address counter 22 or an external address from the address buffer 14, are disposed. The blocks BLK are connected to the input/output data bus I/ODB, which is shared by the banks, via the data bus DB, and the sense buffer/write amplifier SB/WA.

Auto refresh is performed in normal mode where data is read or written, responding to an external command. In this case, refresh refers to a procedure to select a memory cell MC, amplify the information by the sense amplifier SA, and rewrite it back to the memory cell. Therefore a write or read operation cannot be instructed to the memory cell block during refresh. So in normal mode, a refresh operation is executed responding to an auto refresh command from outside, so that the refresh operation does not collide with a read or write operation. An address to select a memory cell to be refreshed, however, is automatically generated inside the memory device. This is "auto refresh".

Specifically, in a prior art in FIG. 24, a refresh signal REF is latched by the command latch 24 when the auto refresh command A-REF is input from outside, and the control circuit 26 controls the refresh operation based on the refresh signal REF. The refresh address is automatically generated by the refresh address counter 22, and the selector 28 selects and supplies a refresh address to the memory block BLK responding to a select signal SEL supplied by the control circuit 26 during refresh. The refresh address counter 22 is counted up eachtime refresh is performed.

Self refresh, on the other hand, is. a refresh automatically performed by the device in power down mode. In power down mode, the memory device deactivates input buffers 10, 12 and 14, so as to stop receiving input signals from outside, and also stops supplying the clock CLK1 to the inside. In this state,a periodic refresh is necessary. So the self refresh control part 18 starts the operation when the device enters power down mode by a clock enable signal CKE to instruct power down. The self refresh control part 18 generates a self refresh instruction signal S-REF1 responding to a timing signal which the oscillator 20, mounted on the device, generates at a predetermined cycle, and the control circuit 26 controls the refresh operation based on the signal S-REF1. The operation of the refresh address counter 22 and the selector 28 is the same as auto refresh.

When such a memory device (DRAM) is mounted in a computer system, refresh has a problem. Especially when auto refresh is performed in normal operation mode, the controller device controlling the memory device must manage the refresh timing of the memory device and supply a refresh command periodically. This control becomes a burden for the controller device.

Also, the memory controller cannot issue a read or write command during the period of auto refresh, which interferes with increasing the speed of the system. To solve this problem, it is discussed in Japanese Patent Laid-Open No. 61-71494 that one write or read operation cycle is divided into two time zones, wherein a write or read operation is performed during one of the time zones, and a refresh operation is performed during the other time zone. However, the semiconductor storage device of this patent has a relatively slow operation speed, and this invention cannot be simply applied to current synchronous type memory devices.

In the case of a synchronous type memory device (SDRAM), where the command cycles are controlled synchronizing with the clocks to be supplied, the activation of the memory core and a read or write operation are all controlled by commands to be supplied, synchronizing with the clocks. Also the operation cycle is fast. Therefore during a normal operation mode period, a voluntary refresh operation by the memory device is inhibited so that a read or write command to be supplied at an arbitrary timing can be handled, as mentioned above. As a result, the outside memory controller controls refresh during the normal operation mode period, and supplies an auto refresh command at a predetermined timing.

Also, in the case of a synchronous type memory device, a read operation and a write operation are not always controlled at the same timing. So it is difficult to execute a read or write operation during one of the two time zones and execute a refresh operation during the other time zone, as in the above mentioned prior art.

SUMMARY OF THE INVENTION

With the foregoing in view, it is an object of the present invention to provide a dynamic memory circuit which does not require refresh control by the memory controller.

It is another object of the present invention to provide a dynamic memory circuit which can automatically perform a refresh operation even in normal operation mode.

It is still another object of the present invention to provide a dynamic memory circuit where increasing the speed of the system is not interfered by a refresh operation.

It is still another object of the present invention to provide a dynamic memory circuit which has a new internal operation cycle and can automatically perform a refresh operation internally.

To achieve the above objects, a first aspect of the present invention is that in a dynamic memory circuit, first and second internal operation cycles are assigned to one external operation cycle according to external commands, a memory core performs a read operation which corresponds to a read command at the first internal operation, and performs a refresh operation which responds to a refresh command at the second internal operation cycle. Also the memory core performs a refresh operation which responds to a refresh command at the first internal operation cycle, and performs a write operation which corresponds to a write command at the second internal operation cycle. It is preferable that when the read or write command is not input, the refresh operation is performed at the earlier internal operation cycle. And a refresh command generation circuit which generates the refresh command at a refresh time is created in the memory circuit.

According to the above first aspect of the invention, the refresh operation is performed responding to the refresh signal generated in the memory circuit, so the memory controller need not supply a refresh command to the memory circuit, which eliminates the burden of managing the refresh operation. The refresh operation is performed at one of the internal operation cycles, and the other internal operation cycle is used for an operation responding to a command from the memory controller, so the memory controller can supply such a command as a read and write command without considering the refresh timing of the memory circuit. Also, the internal operation corresponding to the command does not delay according to the refresh time.

The memory core performs a read operation, which can be executed relatively quickly, at the first internal operation cycle, performs a write operation, which is executed relatively slowly after inputting the write data, at the second internal operation cycle, and during the read operation, the memory core performs a refresh operation at the second operation cycle, and during the write operation, the memory core performs a refresh operation at the first internal operation cycle.

A second aspect of the present invention is a dynamic memory circuit wherein the memory core is logically comprised of a plurality of blocks, for example, a first and second block. And first and second internal operation cycles are assigned to one external operation cycle according to external commands. Responding to one command (read or write) from outside, this command is executed for the first block at the first internal operation cycle, and this command is executed for the second block at the second internal operation cycle. On the other hand, responding to a refresh signal internally generated, refresh for the first block is executed at the second internal operation cycle, and refresh is executed for the second block at the first internal operation cycle.

According to the above mentioned second aspect, the command is executed in the first and second blocks at the first and second internal operation cycles respectively, responding to the external command, so that a fast speed can be maintained. In the first and second blocks, a refresh operation which responds to the refresh signal is executed using the internal operation cycle where operation for a command is not executed, so operation corresponding to the command and the refresh operation do not conflict with each other. In this case as well, the memory controller need not manage the refresh of the memory circuit, and can issue regular commands without concern for the refresh operation.

A third aspect of the present invention is a dynamic memory circuit which has volatile memory cells and performs a refresh operation at a predetermined timing, comprising a memory core. having the memory cells and a refresh command generation circuit which generates a refresh command responding to a refresh signal generated at a predetermined timing, wherein first and second internal operation cycles are assigned to one external operation cycle according to an operation command including a read command and a write command, the memory core, responding to the read command, performs a read operation at the first internal operation cycle, and then performs a refresh operation responding to the refresh command at the subsequent second internal operation cycle, and the memory core, responding to the write command, performs a refresh operation responding to the refresh command at the first internal operation cycle, and performs a write operation at the second internal operation cycle.

A fourth aspect of the present invention is a dynamic memory circuit which has volatile memory cells and performs a refresh operation at a predetermined timing, comprising a memory core having a plurality of memory blocks including the memory cells, and a refresh command generation circuit which generates a refresh command responding to a refresh signal generated at a predetermined timing, wherein a plurality of internal operation cycles are assigned to one external operation cycle according to an operation command, the memory core, responding to the operation command, performs an internal operation corresponding to the operation command in the plurality of memory blocks at each one of the plurality of internal operation cycle respectively, and performs the refresh operation corresponding to the refresh command in the memory block at an internal operation where a corresponding internal operation is not performed.

A fifth aspect of the present invention is a dynamic memory circuit which has volatile memory cells and performs a refresh operation at a predetermined timing, comprising a memory core having first and second memory blocks which include the memory cells respectively, and a refresh command generation circuit which generates a refresh command responding to a refresh signal generated at a predetermined timing, wherein 2N (N is an integer of 1 or more) internal operation cycles are assigned to one external operation cycle according to an operation command, the above mentioned memory core, responding to the operation command, performs an internal operation corresponding to the operation command of the first and second memory blocks at each one of the 2N internal operation cycles respectively, and performs a refresh operation corresponding to the refresh command in the memory blocks at an internal operation cycle where a corresponding internal operation is not performed.

The above mentioned fifth aspect of the present invention may comprise 2M memory blocks in the memory core.

In a preferred embodiment of the above mentioned invention, the memory core further comprises word lines, bit lines crossing thereof, a sense amplifier to be connected to the bit lines, and the memory cells in association to the word lines and the bit lines, and the memory core activates the word line and the sense amplifier then precharges the bit lines during the internal operation cycle, responding to the operation command.

BRIEF DESCRIPTION OF THE DRAWINGS

FIG. 15 is a diagram depicting an operation in the fifth embodiment;

DESCRIPTION OF THE PREFERRED EMBODIMENTS

Embodiments of the present invention will now be described with reference to the accompanying drawings. These embodiments, however, do not limit the technical scope of the present invention.

Figure 1:
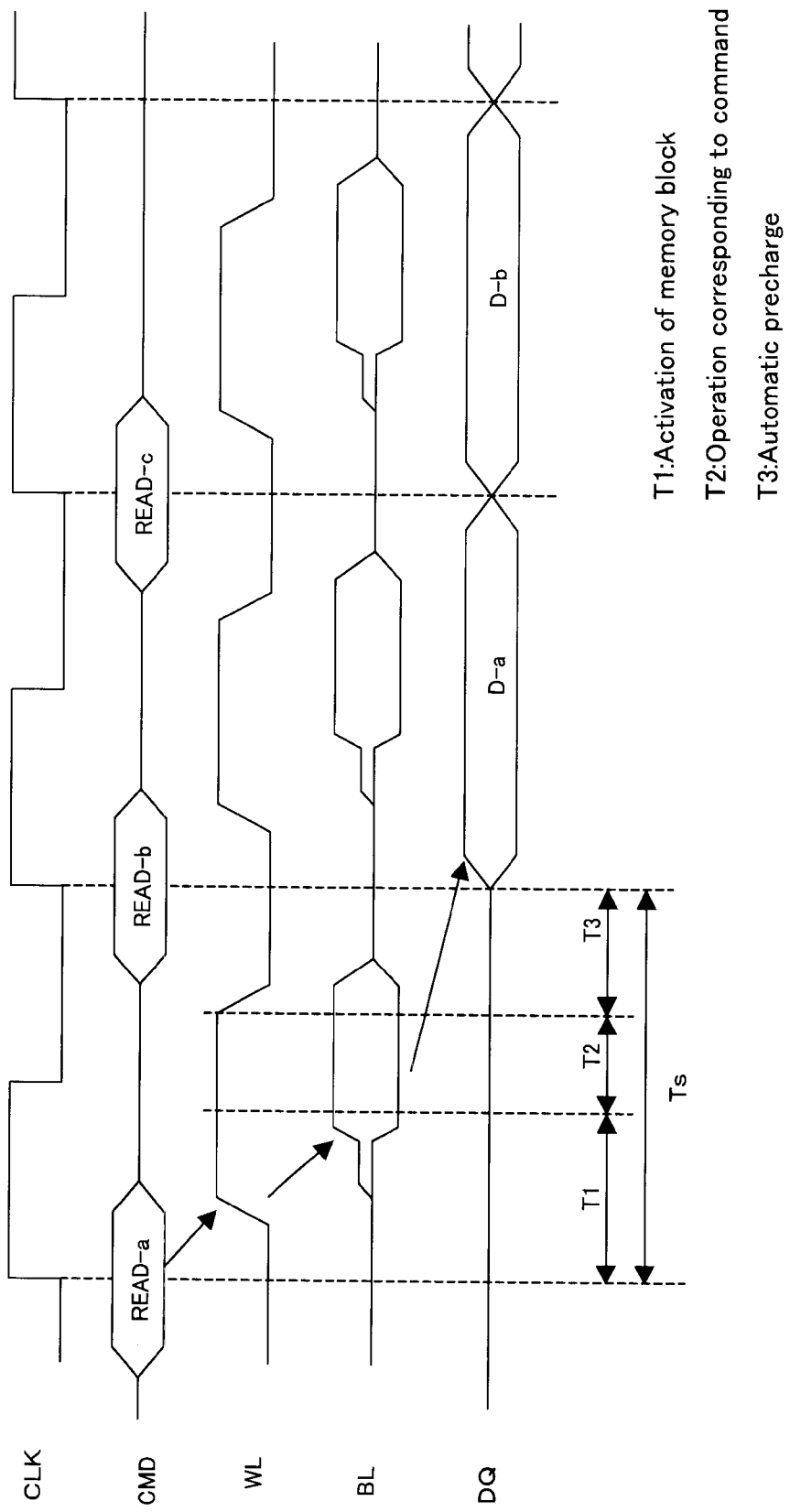
FIG. 1 is a timing chart depicting an operation of a preferred memory core to which the present invention is applied.

FIG. 1 is a timing chart depicting a preferred operation of a memory core to which the present invention is applied. As mentioned later, the memory core comprises a plurality of word lines, a plurality of bit lines crossing thereof, a plurality of memory cells positioned at the crossing positions thereof, and a sense amplifier to be connected to the bit lines. The memory circuit of the present embodiment is a synchronous type memory device where an internal operation corresponding to a command is executed synchronizing with clocks supplied from outside.

Particularly, a preferred memory circuit is, for example, FCRAM (Fast Cycle RAM), which the present applicant proposed separately, and is a memory circuit disclosed in the International Patent Application W098/56004. FIG. 1 is a diagram depicting an operation of a memory core of such a memory circuit.

As FIG. 1 shows, the operation cycle Ts for each operation command, such as a read or write command, which is supplied synchronizing with the external clocks, includes a period T1 when the memory core is activated and the word lines WL are started, a period T2 when the sense amplifier is activated and a read or write corresponding to the operation command is performed, and a period T3 when the sense amplifier is automatically deactivated and the bit lines BL are precharged. And read data D-a and D-b for the read command is output during the next operation cycle. By ending the above three cycles within one operation cycle responding to the operation command, the command cycle can be decreased and the access time for random access can be decreased.

First Embodiment

Figure 2:
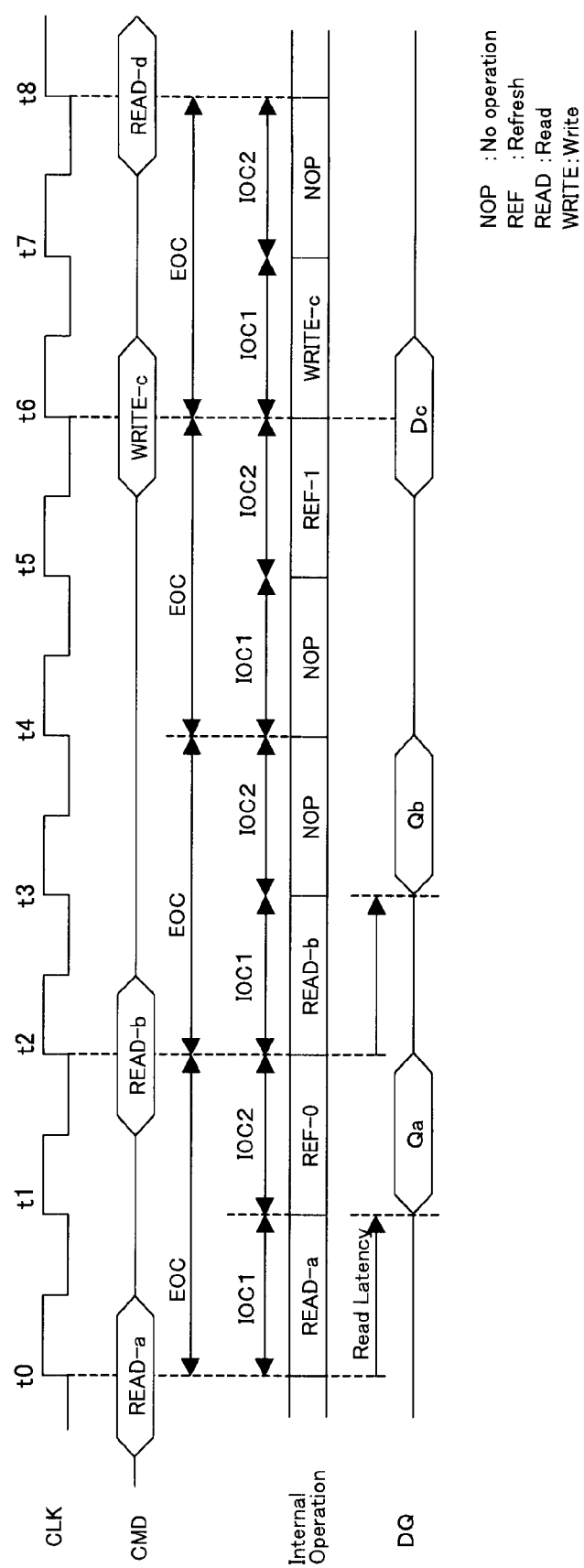
FIG. 2 is a diagram depicting an operation in the first embodiment.

FIG. 2 is a diagram depicting an operation in the first embodiment. In the first embodiment, a first and second internal operation cycles IOC1 and IOC2 are assigned to one external operation cycle EOC according to the command CMD, where the internal operation READ or WRITE correspond to the above mentioned command is performed in the first internal operation cycle IOC1, and the refresh operation REF, which responds to the internal refresh command, is performed in the second internal operation cycle IOC2. And, as described later, the refresh command generation circuit to generate an internal refresh command at the refresh time is provided in the memory circuit.

Also in the first embodiment, if an operation command is not supplied, a refresh operation is performed at the earlier internal operation cycle of the first and second internal operation cycles IOC1 and IOC2.

In the example shown in FIG. 2, the command CMD is supplied at every 2 clock cycles of the external clock CLK. Therefore, the external operation cycle EOC is set to 2 clock cycles. Also the first and second internal operation cycles IOC1 and IOC2 are set to 1 clock cycle. For example, responding to the read command READ-a, which is supplied synchronizing with the rise edge of the clock CLK at time t0, the read operation READ-a is executed at the subsequent first internal operation cycle IOC1. Within this first internal operation cycle IOC1, the memory core is activated, a read operation is performed, and an automatic precharge is performed, as described in FIG. 1. At the subsequent second internal operation cycle IOC2, data Qa is output from the data input/output terminal DQ. Therefore, the read latency is 2 in this example.

Responding to the read command READ-b, which is supplied synchronizing with the rise edge of the clock CLK at time t2, the read operation READ-b is executed at the first internal operation cycle IOC1, and the read data Qb is output from the data input/output terminal DQ at the subsequent second internal operation cycle IOC2. At time t4, an operation command is not supplied. And responding to the write command WRITE-c, which is supplied synchronizing with the rise edge of the clock CLK at time t6, the write operation WRITE-c of the write data Dc is performed at the first internal operation cycle IOC1. Therefore, the write latency is 1 in this example.

In this way, an internal operation corresponding to the operation command CMD is executed at the first internal operation cycle IOC1. At the second internal operation cycle IOC2, on the other hand, a refresh operation responding to the refresh signal generated inside the device is performed. In the case of the example in FIG. 2, the first refresh operation REF-0 is executed at the second internal operation cycle IOC2, which follows time t1, and the second refresh operation REF1 is executed at the second internal operation cycle IOC2, which follows time t5.

Since the write latency is 1, the write command WRITE cannot be supplied at time t4. In other words, at time t4, the read data Qb of the previous cycle is still being output from the data input/output terminal DQ, so if write data is supplied at the timing of time t4, a conflict occurs. Therefore the write command WRITE-c is supplied at time t6.

Figure 3:
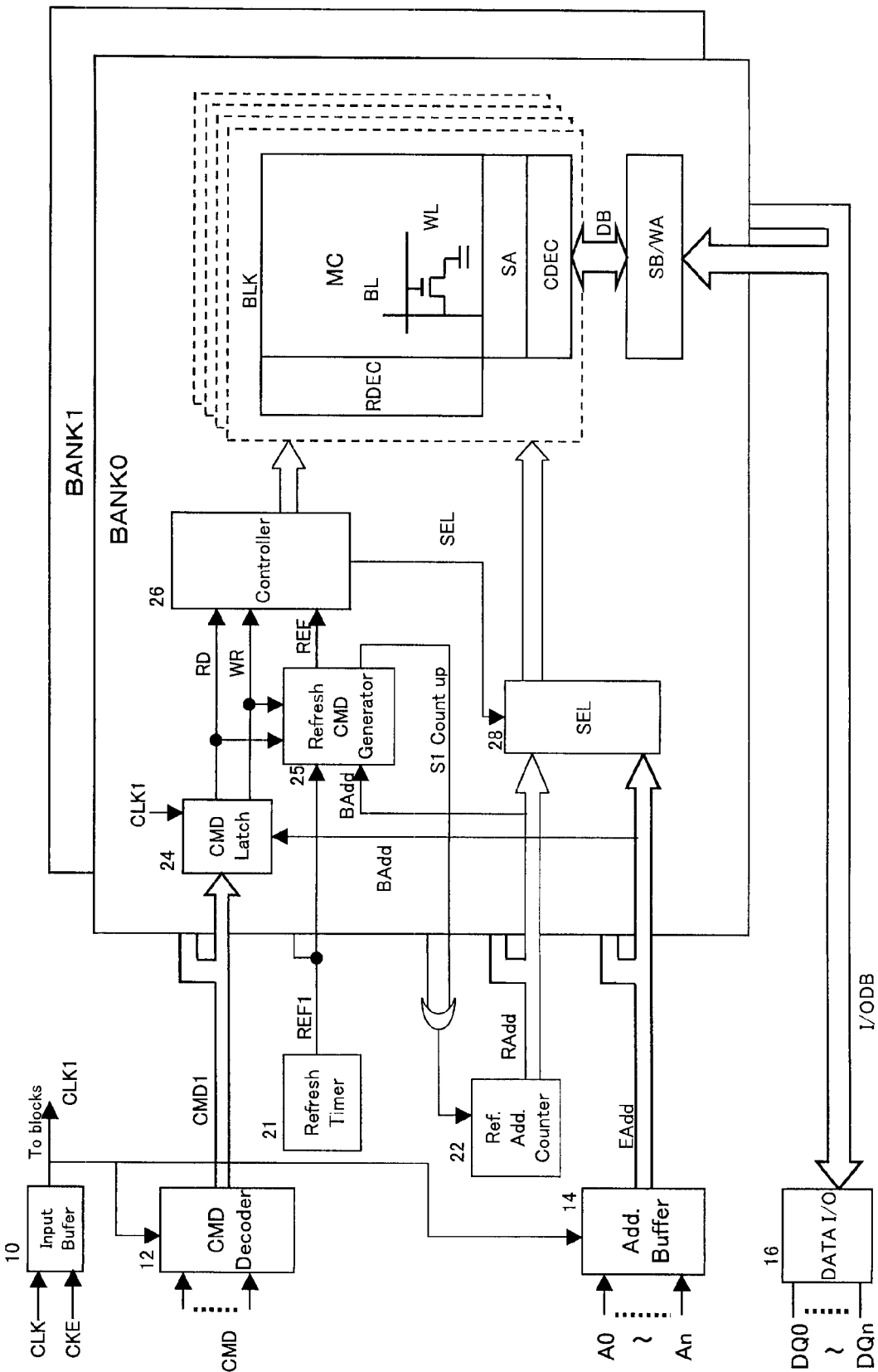
FIG. 3 is a diagram depicting a configuration of a memory circuit in the first embodiment.
Figure 24:
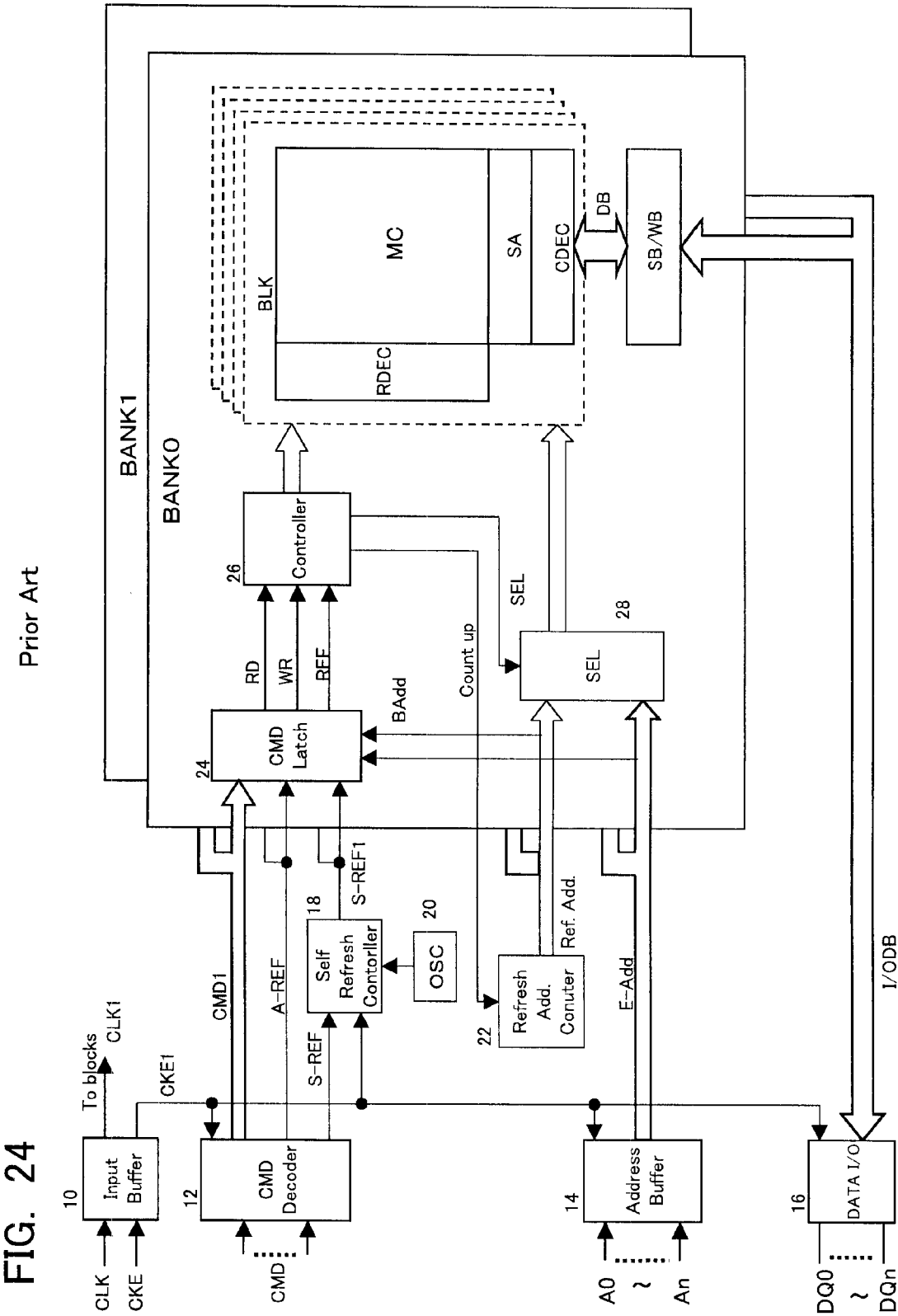
FIG. 24 is a diagram depicting a configuration of a conventional synchronous type dynamic memory circuit.

FIG. 3 is a diagram depicting a configuration of the memory circuit in the first embodiment. The same reference numbers as the prior art in FIG. 24 are assigned for the parts which are the same as the prior art. In FIG. 3, the input buffer 10 which latches the external clock CLK, the command decoder 12, the address buffer 14, the data input/output buffer register 16, and the refresh address counter 22 are the same as the prior art. The configuration of the memory banks BANK0 and BANK1, which are the memory core, is also the same, so are the memory block BLK, the row decoder RDEC, the memory cell array MC, the sense amplifier SA, the column decoder CDEC, the data bus DB, the sense buffer/write amplifier SB/WA, the selector 28 and the command latch 24. In the memory cell array MC, a plurality of bit lines BL and a plurality of word lines WL are positioned crossing each other, and a memory cell which is comprised of one transistor and one capacitor is positioned at these crossing positions.

The memory circuit shown in FIG. 3 further comprises a refresh timer 21 which generates the refresh signal REF1 at each refresh timing and a refresh command generation circuit 25. In normal operation mode and power down mode, the refresh command generation circuit 25 checks the status of the read signal RD and the write signal WR generated by the command latch 24, responding to the refresh time signal REF1 generated by the refresh timer 21, and generates the internal refresh command REF when no internal operation is under execution. Responding to this internal refresh command REF, the control circuit 26 executes the refresh operation for the address memory block BLK specified by the refresh address.

Figure 4:
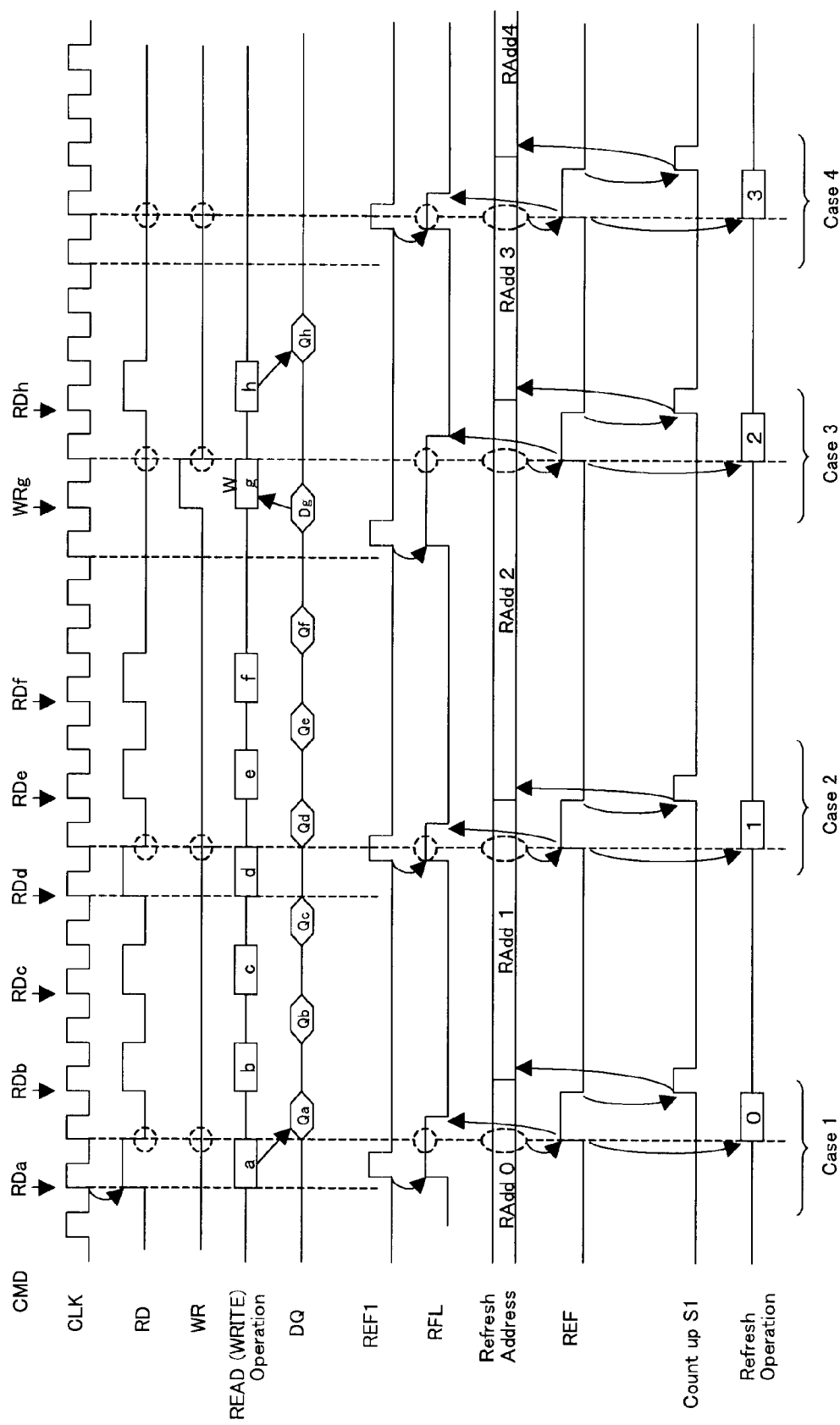
FIG. 4 is a timing chart depicting an internal operation in the first embodiment.

FIG. 4 is a timing chart depicting the internal operation in the first embodiment. The internal operation will now be described with reference to FIG. 4. As a condition, the command latch 24 holds the internal command CMD1 generated by the command decoder 12 during the first internal operation cycle IOC1. Therefore the read signal RD or the write signal WR becomes H level only during the first internal operation cycle IOC1. The control circuit 26 performs the respective internal operation for the memory block BLK responding to the read signal RD, the write signal WR or the internal refresh command REF. The refresh command generation circuit 25 generates a count up signal S1 each time the internal refresh command REF is generated, and responding to this count up signal S1, the refresh address counter 22 increments the refresh address RAdd.

Case 1 when a read command and a refresh time overlap will now be described with reference to FIG. 4. Responding to the first read command RDa, the command latch 24 holds the read signal RD (=H level) for only 1 clock cycle which corresponds to the first internal operation cycle when the bank select address BAdd is its own bank address. Responding to this read signal RD, normal read operation a is executed by the control circuit 26, and the read data Qa is output from the data input/output terminal DQ at the next clock cycle (internal operation cycle).

While the above read operation a is executed, the refresh timer 21 detects that the time for refresh has come, and sets the refresh timer signal REF1 to H level. Responding to the H level of the refresh timer signal REF1, the refresh command generation circuit 25 sets the internal refresh flag RFL to H level and stands by until the read operation ends. When the refresh command generation circuit 25 detects that the refresh flag RFL is at H level and both the read signal RD and the write signal WR, which are held by the command latch 24, are at L level, the refresh command generation circuit 25 sets the internal refresh command REF to H level. The refresh command generation circuit 25, however, sets the internal refresh command REF to H level only when the refresh address RAdd selects its own bank. The internal refresh command REF is set to H level only during the second internal operation cycle (1 clock cycle).

Responding to the internal refresh command REF, the control circuit 26 has the block BLK corresponding to the refresh address RAdd0 execute the refresh operation. This refresh operation ends within the second internal operation cycle (1 clock cycle). When the refresh operation ends, the count up signal S1 is generated, and responding to this signal, the refresh address counter 22 increments the refresh address RAdd.

Then for the read commands RDb and RDc as well, the corresponding read operations b and c are executed within the first internal operation cycle, and the read data Qb and Qc are output from the data input/output terminal DQ in the subsequent second internal operation cycle.

Case 2 is also when the read command and refresh time overlap, just like in case 1, where the read operation corresponding to the read command RDb is executed at the first internal operation cycle in the same manner. When the refresh timer signal REF1 is generated during this execution, the refresh command generation circuit 25 sets the internal refresh flag RFL to H level and stands by. When both the read signal RD and the write signal WR are at L level and the refresh address RAdd1 selects its own bank, the refresh command generation circuit 25 generates the internal refresh command REF (H level) at the subsequent second internal operation cycle. Responding to this, the refresh operation is executed.

Case 3 is when the time of supplying the write command WRg and refresh time overlap, where the refresh timer signal REF1 is generated and the refresh flag RFL become H level just before the write command is supplied. However, the command latch 24 sets the write signal WR to H level so as to indicate that an internal write operation is progressing, therefore the refresh command generation circuit 25 waits until the end of the write operation g, then generates the internal refresh command REF (H level).

Case 4 is when no operation command is supplied, where the refresh command generation circuit 25 generates the internal refresh command REF (H level) immediately, responding to the generation of the refresh timer signal REF1, and executes refresh. When an operation command is not supplied, the command latch 24 does not set the internal read signal RD or the write signal WR to H level, so refresh is executed at the earlier, first or second, internal operation cycle period. If the read or the write command is supplied, however, that command has priority, and the refresh operation stands by until the second internal operation cycle.

Figure 5:
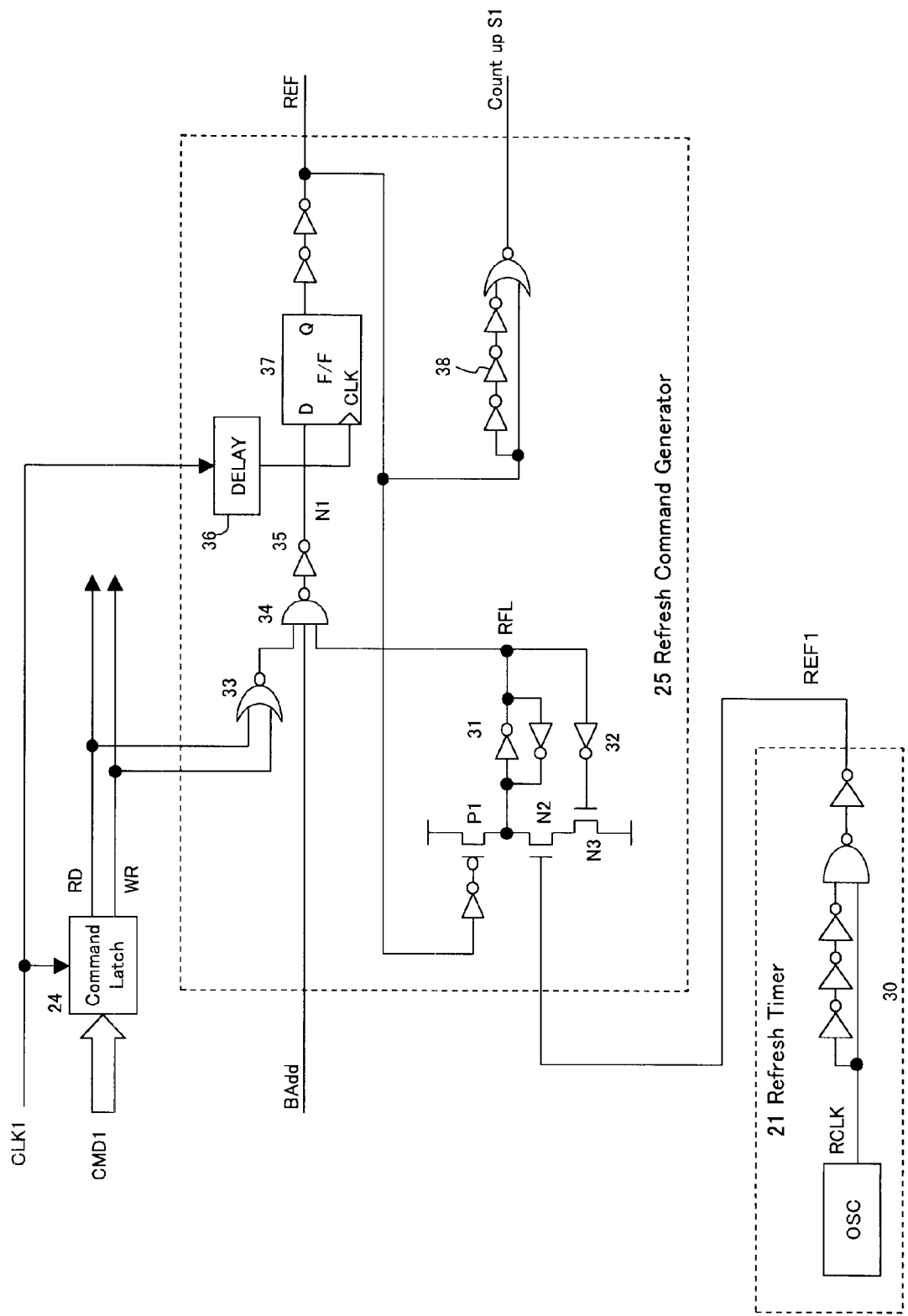
FIG. 5 is a circuit diagram of a refresh command generation circuit in the first embodiment.

FIG. 5 is a circuit diagram of the refresh command generation circuit in the first embodiment. FIG. 5 shows the command latch 24, the refresh timer 21 and the refresh command generation circuit 25. The refresh timer 21 has a very low-speed oscillation circuit OSC, and this oscillation circuit OSC generates the clock RCLK at a frequency corresponding to the refresh cycle. And the pulse generation circuit 30 generates the refresh timer signal REF1 synchronizing with the rise edge of the clock RCLK.

The bank select address BAdd, the read signal RD and write signal WR generated by the command latch 24, and the refresh timer signal REF1 are supplied to the refresh command generation circuit 25. When the refresh timer signal REF1 becomes H level, the transistor N2 turns ON, the latch circuit 31 is inverted by this transistor N2 and the transistor N3 which is in ON status, and the refresh flag RFL is set to H level. In this state, if the bank select address BAdd in the refresh address RAdd is at H level (BANK0 is selected), when both the read signal RD and the write signal WR are at L level, the output of the NOR gate 33 becomes H level, and the node N1 becomes H level via the NAND gate 34 and the inverter 35.

The delay circuit 36 supplies the same delay time as the delay time of the command latch 24 and the gates 33, 34 and 35 to the clock CLK1, and supplies the latch clock to the flip-flop 37 at the timing when the level of the node N1 is determined. Therefore the signal of node N1 at H level is latched by the flip-flop 37, and the internal refresh command REF becomes H level. Responding to the H level of this internal refresh command REF, the control circuit 26 executes a refresh operation.

On the other hand, the pulse generation circuit 38 generates the count up signal S1 responding to this refresh command REF, and increments the refresh address counter 22. Also responding to the refresh command REF, the P channel transistor P1 turns ON, inverts the latch circuit 31, and returns the refresh flag RFL to L level. Responding to this, the flip-flop 37 is inverted at the timing of the next clock CLK1, and the internal refresh command REF is returned to L level.

As FIG. 3 shows, in power down mode, the input buffer 10, the command decoder 12, the address buffer 14, and the data input/output buffer register 16 enter an inactive state and the internal clock pauses. However, in this case as well, the oscillation circuit OSC of the refresh timer 21 generates the clock of the operation cycle of the memory block to perform a refresh, so that a self refresh is performed. In power down mode, both the read signal RD and the write signal WR generated by the command latch 24 are at L level, so the internal refresh command REF is generated whether in the first or second internal operation cycle, and a refresh operation is executed.

As described above, in normal operation mode in the first embodiment, an internal operation corresponding to the operation command is executed at the first half internal operation cycle of the external operation cycle, which is the shortest command cycle, and a refresh operation is executed at the latter half internal operation cycle responding to the refresh timer signal. Therefore the memory controller need not supply the refresh command, and the memory device side can execute a refresh automatically, making adjustments with the normal operation command.

Second Embodiment

In the second embodiment, the two internal operation cycles IOC1 and IOC2 are set in one external operation cycle EOC, which is the shortest command cycle, just like the first embodiment. However, in the second embodiment, the read operation is executed within the first internal operation cycle IOC1, which is the first half, responding to the read command, and the write operation is executed within the second internal operation cycle IOC2, which is the latter half, responding to the write command. In other words, the read latency is set to 2, and the write latency is also set to 2.

Responding to the refresh timer signal to notify the refresh timing generated by the refresh timer inside the memory device, a refresh operation is executed at the earlier, the first or second internal operation cycle, when neither the read nor write internal operation is performed. Even if the operation command and the refresh timer signal overlap, the refresh operation is executed within the period since one of the two internal operation cycles is open.

Figure 6:
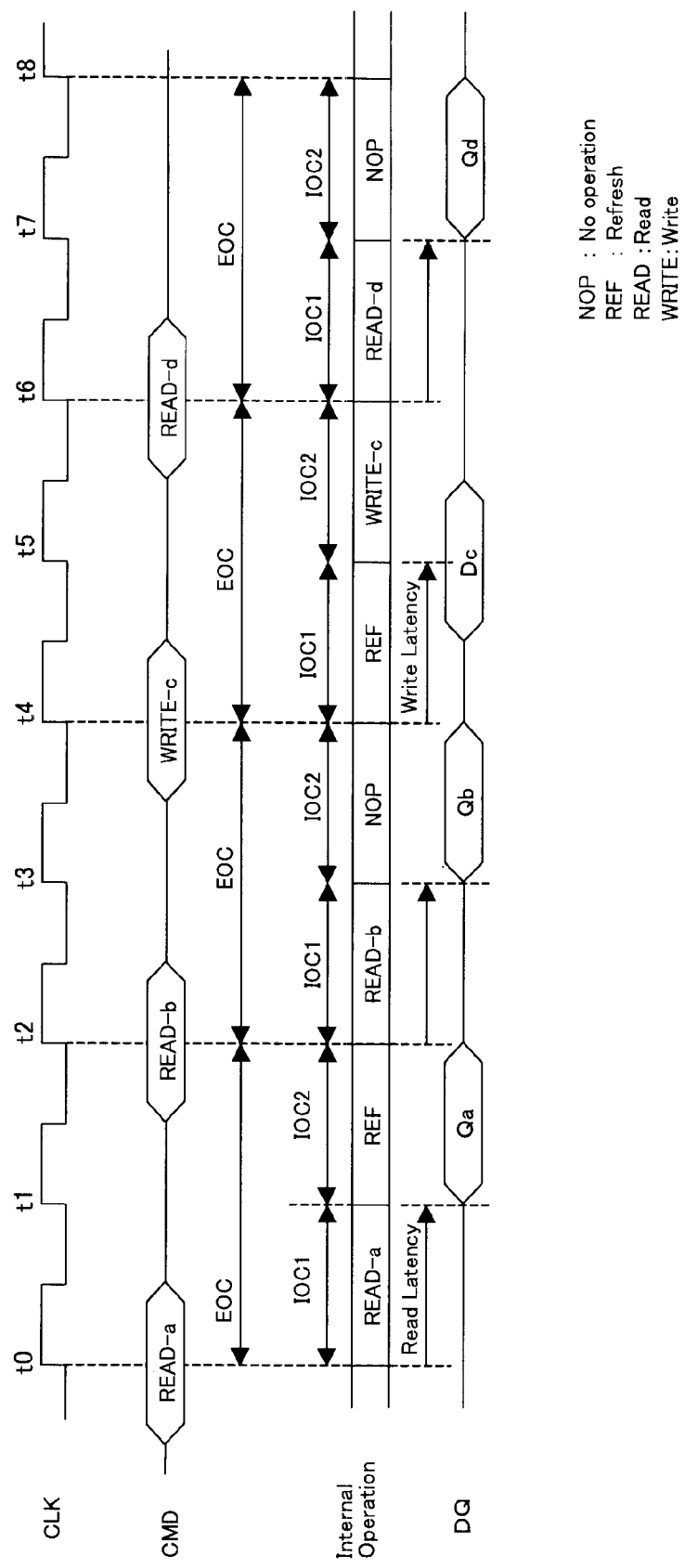
FIG. 6 is a diagram depicting an operation of the second embodiment.

FIG. 6 is a diagram depicting an operation of the second embodiment. Responding to the read command READ-a supplied at time t0, the memory core executes the read operation READ-a at the first internal operation cycle IOC1. And at the subsequent internal operation cycle IOC2, the read data Qa is output from the input/output terminal DQ. In other words, the read latency is 2. In the example in FIG. 6, the refresh operation REF is executed during the second internal operation cycle IOC2 which follows the rise edge of the clock CLK at time t1.

In the same way, the read operation READ-b is executed during the first half internal operation cycle IOC1 responding to the read command READ-b supplied at time t2. In the example in FIG. 6, the refresh operation is not executed within the latter half internal operation cycle IOC2.

Then responding to the write command WRITE-c supplied at time t4, the memory core executes the write operation WRITE-c during the second internal operation cycle after 1 clock cycle. So for this write operation, the write data is supplied from the input/output terminal DQ synchronizing with time t5. In this case, the read data Qb corresponding to the read operation READ-b at the previous external operation cycle is output from the input/output terminal DQ during the second internal operation cycle IOC2 of the previous external operation cycle, therefore the write data Dc at time t5 does not collide with the read data Qb. So by setting the write latency to 2, the read command and the write command can be continuously supplied at 2 clock cycles, that is, at the external operation cycle. In other words, the read command and the write command can be supplied at equal intervals. In the example in FIG. 6, the internal refresh operation REF is executed at the first internal operation cycle IOC1 after time t4.

The time difference between the output of the read data Qb and the input of the write data Qc is an interval required to prevent overlapping of these data on the input/output data bus I/ODB.

As described above, in the second embodiment, the internal operation for the read command is executed at the first internal operation cycle IOC1, and the internal operation for the write command is executed at the second internal operation cycle IOC2. When the operation command and the refresh timing overlap, in the case of the read command, a refresh is executed at the second internal operation cycle IOC2, after the read operation is executed, and in the case of the write command, the write operation is executed at the second internal operation cycle IOC2 after the refresh operation is executed.

Figure 7:
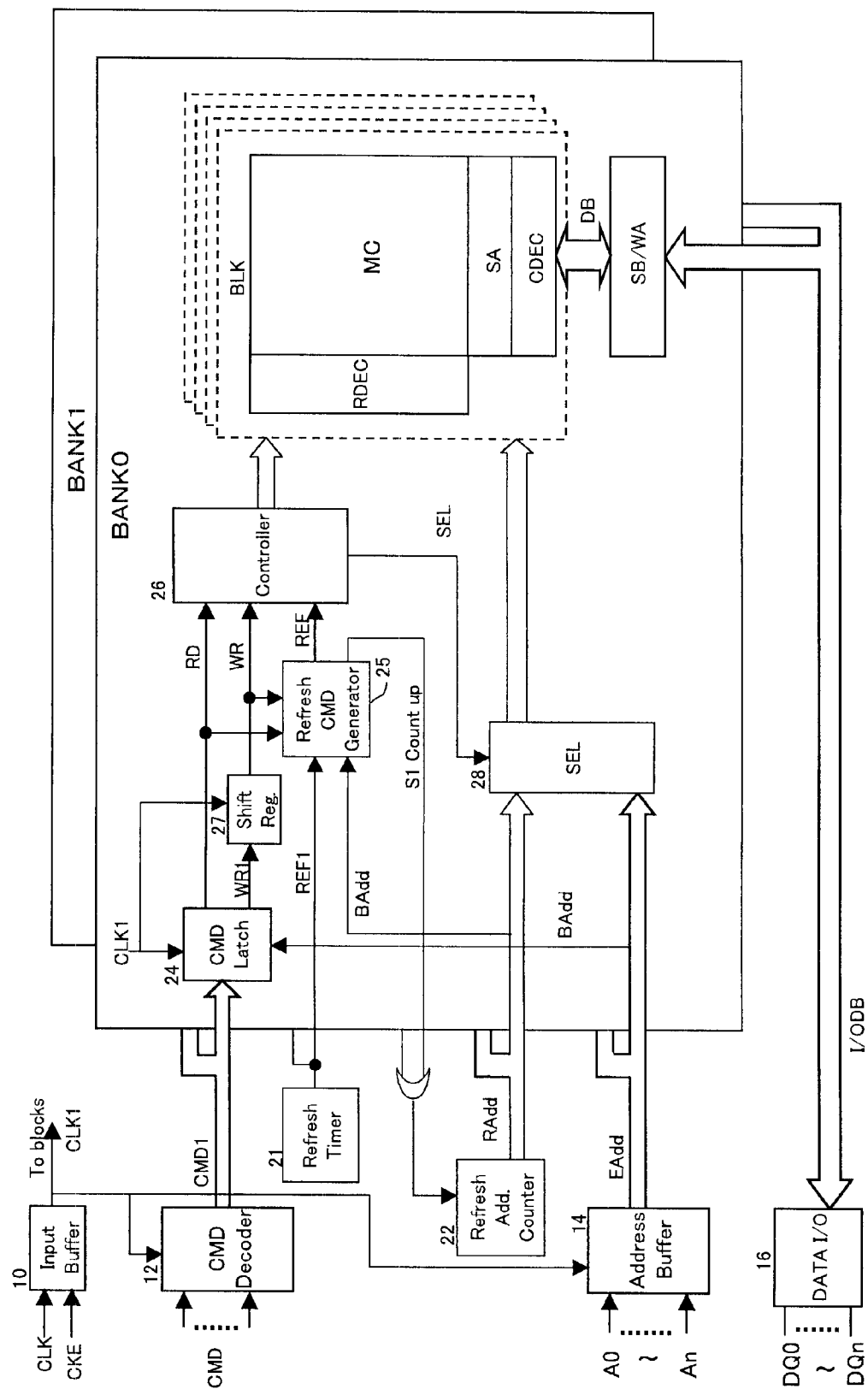
FIG. 7 is a diagram depicting a configuration of a memory circuit in the second embodiment.

FIG. 7 is a diagram depicting a configuration of the memory circuit in the second embodiment. The parts which are the same as the first embodiment in FIG. 3 are denoted with the same reference numbers. The difference of the configuration in FIG. 7 from the example in FIG. 3 is that a shift register 27, which delays the write signal WR1 latched by the command latch 24 only for 1 clock cycle, is disposed between the command latch 24 and the control circuit 26. This shift register 27 supplies the write signal WR to the control circuit 26 1 clock cycle behind the command supply, and as a result, the internal write operation is executed at the second internal operation cycle.

Figure 8:
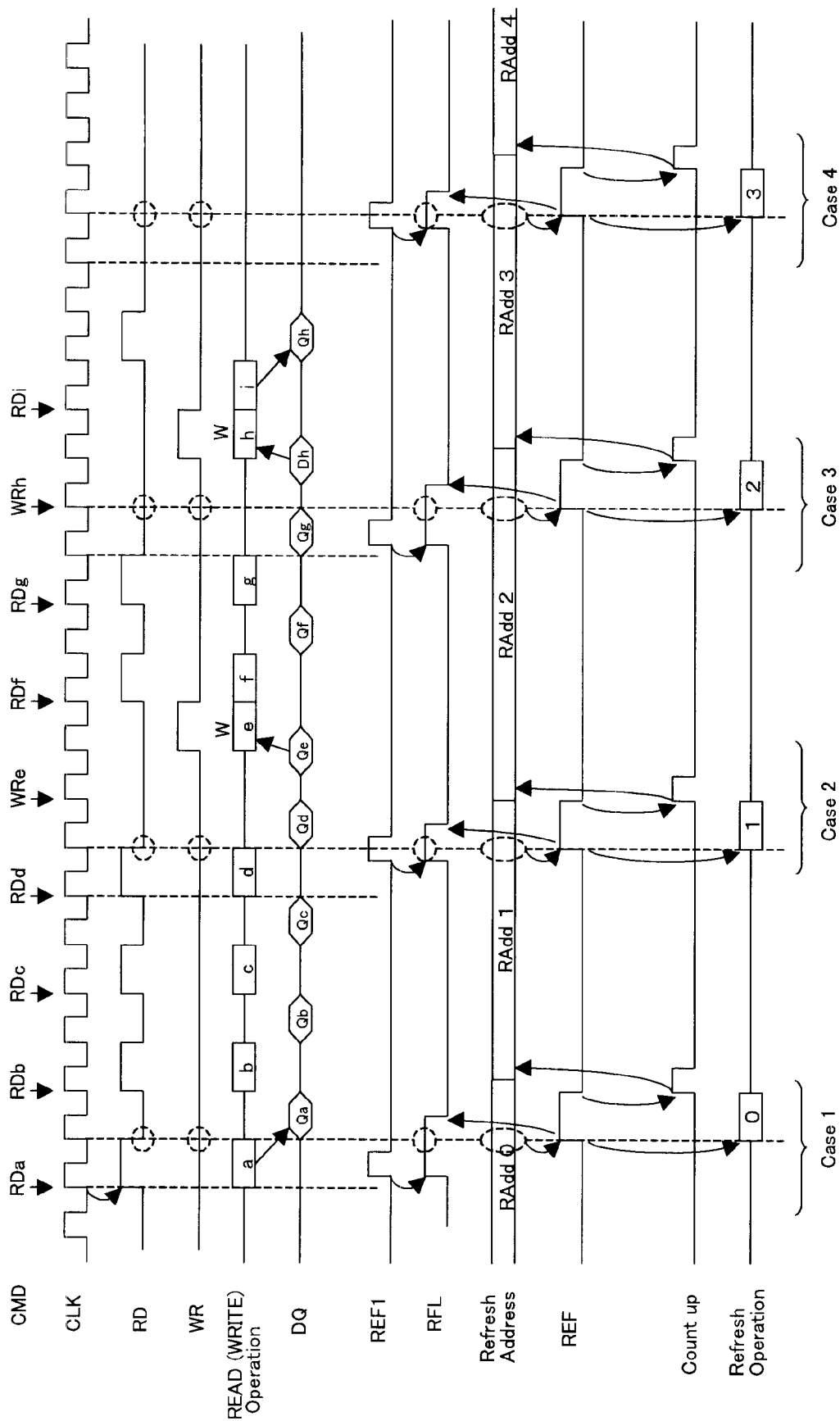
FIG. 8 is a timing chart depicting an internal operation in the second embodiment.

FIG. 8 is a timing chart depicting an internal operation of the second embodiment in more detail. Just like the first embodiment in FIG. 4, both cases 1 and 2 are when the read commands RDa and RDd and the refresh time signal REF1 overlap, case 3 is when the write command WRh and the refresh timer signal REF1 overlap, and case 4 is when no operation command overlaps with the refresh timer signal REF1. Therefore cases 1 and 2 are the same as FIG. 4.

In case 3, the refresh flag RFL in the refresh command generation circuit 25 becomes H level responding to the generation of the refresh timer signal REF1. At this time, the write command WRh is supplied, and the write signal WR is supplied to the control circuit 26 1 clock cycle behind by the shift register 27. And at the first internal operation cycle IOC1 after the write command WRh is supplied, the refresh operation 2 corresponding to the refresh address RAdd2 is executed. The write operation W/h corresponding to the write command is executed at the next internal operation cycle IOC2.

As FIG. 8 shows, the read command RD and the write command WR are continuously supplied at 2 clock cycles, which is the shortest.

In case 4, no operation command is supplied, so the refresh operation is executed at the earlier internal operation cycle out of the first half or latter half internal operation cycles.

The refresh command generation circuit 25 in the second embodiment has the same configuration as the circuit in the first embodiment shown in FIG. 5.

Third Embodiment

The third embodiment is characterized in that the data transfer rate is improved by inputting/outputting data in burst mode in the first or second embodiment.

Figure 9:
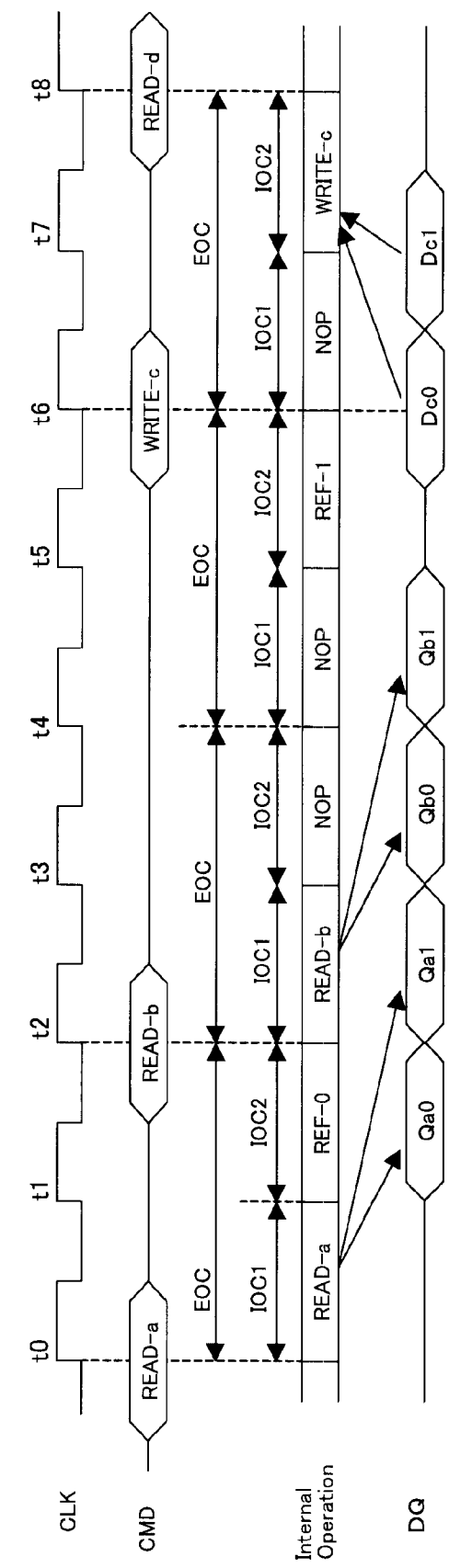
FIG. 9 is a diagram depicting an operation in the third embodiment.

FIG. 9 is a diagram depicting an operation in the third embodiment. Responding to the read command READ-a supplied at time t0, the memory core executes the read operation at the first internal operation cycle IOC1. Compared with the first and second embodiments, twice as much read data Qa0 and Qa1 are read, and the read data Qa0 and Qa1 are output in serial from the input/output terminal DQ at the subsequent internal cycle IOC2 at time t1 and at the internal operation cycle IOC1 at time t2 respectively. The read operation for the read command READ-b supplied at time t2 is also the same as above. And at the internal operation cycles IOC2 and IOC1 at times t3 and t4, the read data Qb0 and Qb1 are output respectively.

Since the read operation is executed at the first half internal operation cycle IOC1 of the external operation cycle EOC, the memory core can execute the refresh REF-0 at the latter half internal operation cycle IOC2.

In this embodiment, the write command cannot be supplied at time t4 since burst mode is used. The write operation for the write command WRITE-c supplied at time t6 is executed at the second internal operation cycle at time t7. The write data Dc0 and Dc1 for this write operation are supplied at times t6 and t7 respectively in serial, and are written at the same time. Therefore, refresh can be executed at the internal operation cycle IOC1 at time t6. Since an operation command is not supplied at time t4, the refresh REF-1 is executed at the second interval operation cycle IOC2 at time t5 in the example in FIG. 9.

This refresh REF-1 can also be executed at the first internal operation cycle IOC1 at time t4 or t6.

Figure 10:
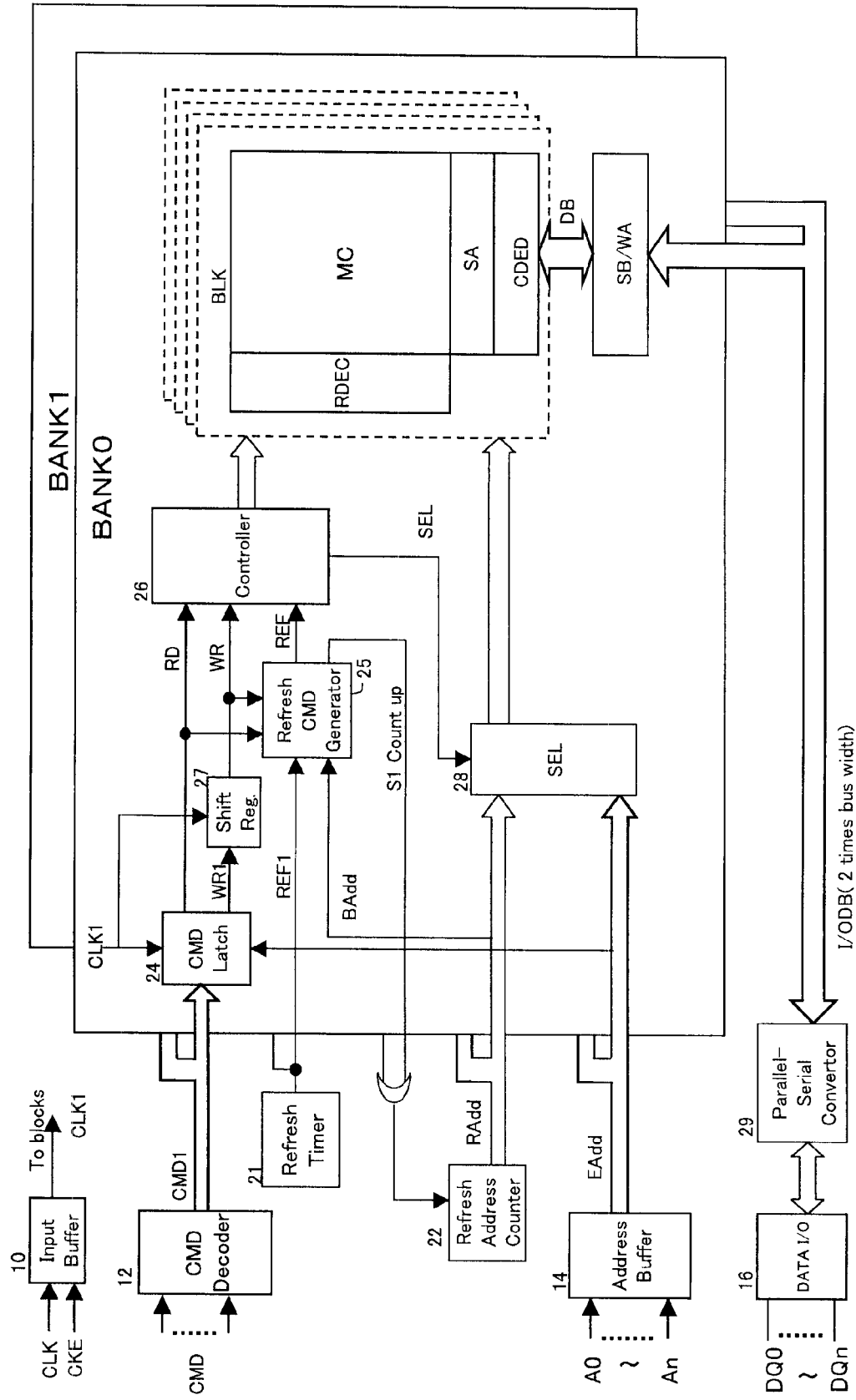
FIG. 10 is a diagram depicting a configuration of a memory circuit in the third embodiment.

FIG. 10 is a diagram depicting a configuration of a memory circuit in the third embodiment. Just like the second embodiment shown in FIG. 7, the shift register 27, which delays the write signal WR for 1 clock cycle, is disposed between the command latch 24 and the control circuit 26. In the example in FIG. 10, the bus width of the input/output data bus I/ODB is double that in FIG. 7, so the parallel/serial conversion circuit 29 is disposed between the input/output data bus I/ODB and the data input/output buffer register 16.

This parallel/serial conversion circuit 29 converts parallel data to serial data and outputs when reading, and when writing the parallel/serial conversion circuit 29 converts serial data to parallel data and inputs.

Figure 11:
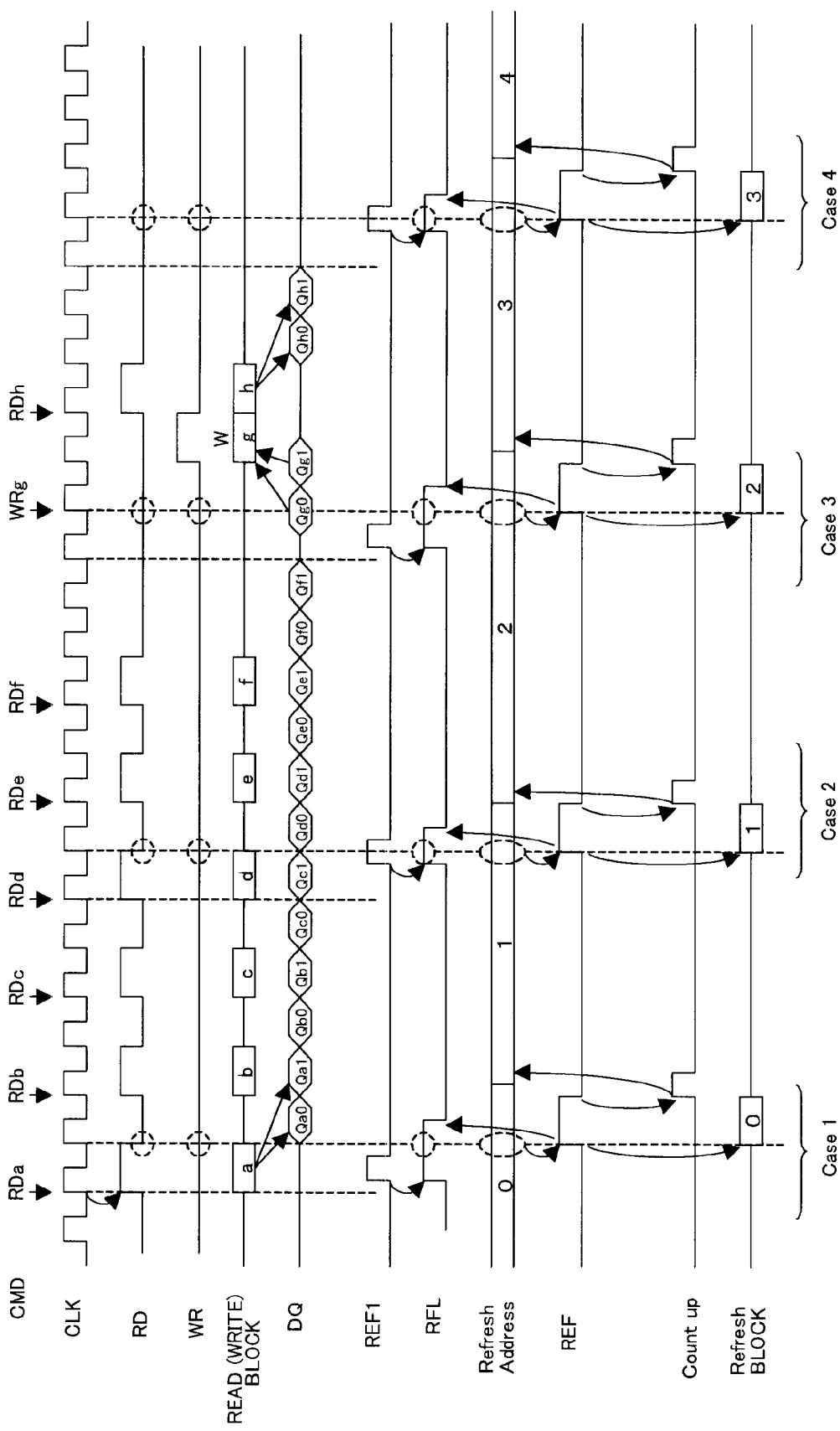
FIG. 11 is a timing chart depicting an internal operation in the third embodiment.

FIG. 11 is a timing chart depicting an internal operation in the third embodiment. Responding to the write commands RDa –RDf, the respective two sets of data, Qa0, Qa1–Qf0, Qf1, are continuously output for each internal operation cycle. Therefore data output efficiency is improved. When the read command and the refresh timer signal REF1 overlap as in cases 1 and 2, the respective refresh operation is executed at the latter half internal operation cycle in the memory block. When the write command WRg and the refresh timer signal REF1 overlap as in case 3, the refresh operation is executed at the first half internal operation cycle, and the write operation g is executed at the latter half internal operation cycle, in the memory block.

Fourth Embodiment

In the first to third embodiments, the frequency of the clock signal CLK supplied from outside is the same as the internal operation cycle IOC. In the fourth embodiment, however, the clock signals CLK and CLK1 are the same as the external operation cycle EOC, and the clock signal CLK2 for the internal operation cycle is generated inside the memory device.

Figure 12:
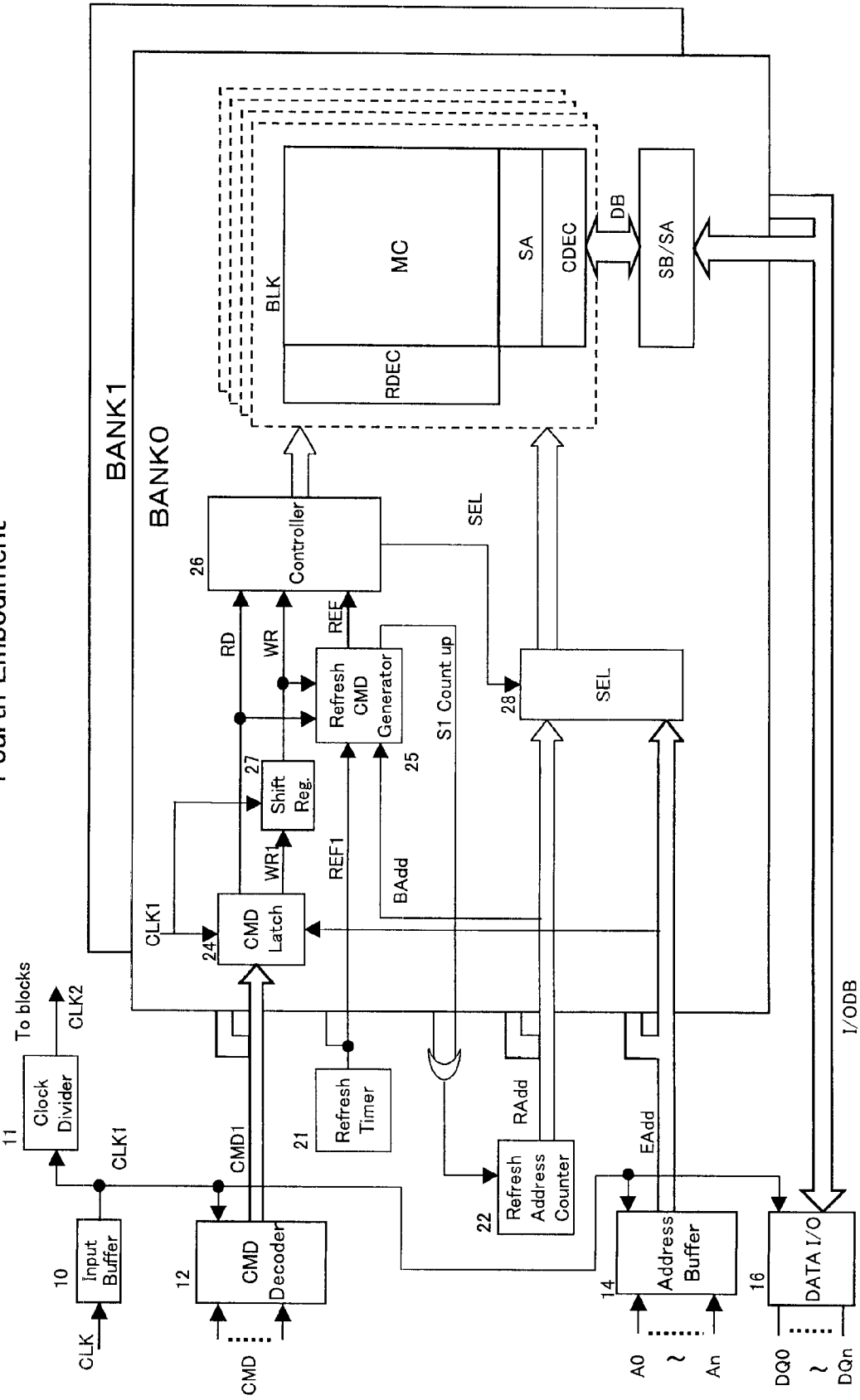
FIG. 12 is a diagram depicting a configuration of a memory circuit in the fourth embodiment.

FIG. 12 is a diagram depicting a configuration of a memory circuit in the fourth embodiment. In this configuration, the clock multiplication circuit (dividing circuit) 11 is added to s the configuration in the second embodiment shown in FIG. 7. The fourth embodiment, however, can be applied to any one of the first to third embodiments and the later mentioned fifth embodiment. As FIG. 12 shows, in the fourth embodiment, the clock CLK1 supplied from outside is supplied to the interface circuits 10, 12, 14 and 16, an input circuit for example, so as to enable input/output synchronizing with the external clock, and the clock multiplication circuit 11 for dividing the clock CLK1 is set, on the other hand, so as to supply the clock CLK2 where frequency is multiplied, to such an internal circuit as the memory core.

Figure 13A:
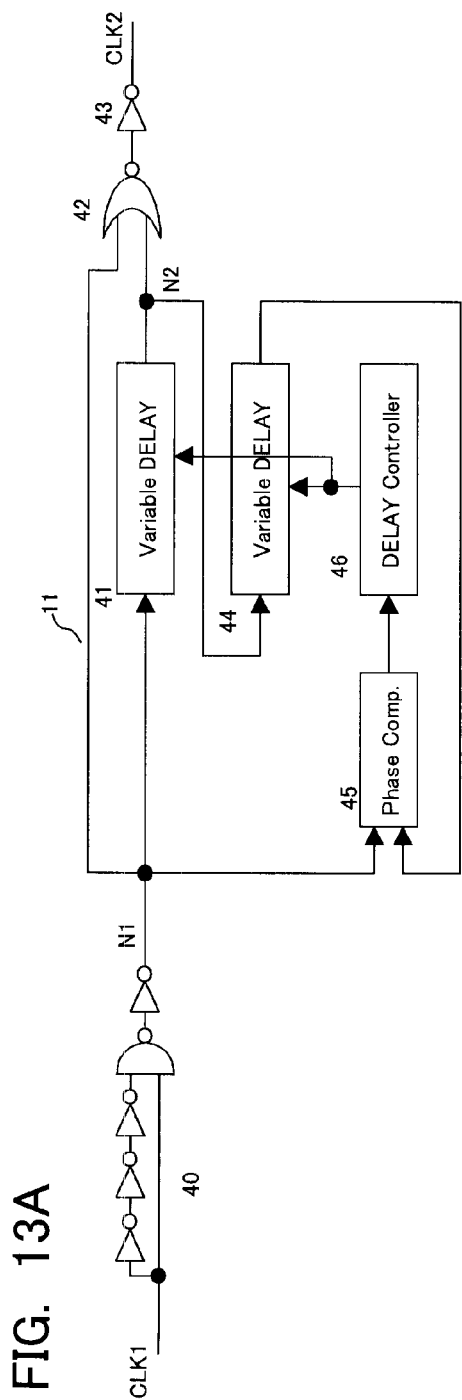
FIGS. 13A and 13B are diagrams depicting a first circuit example and an operation of a clock multiplication circuit.
Figure 13B:
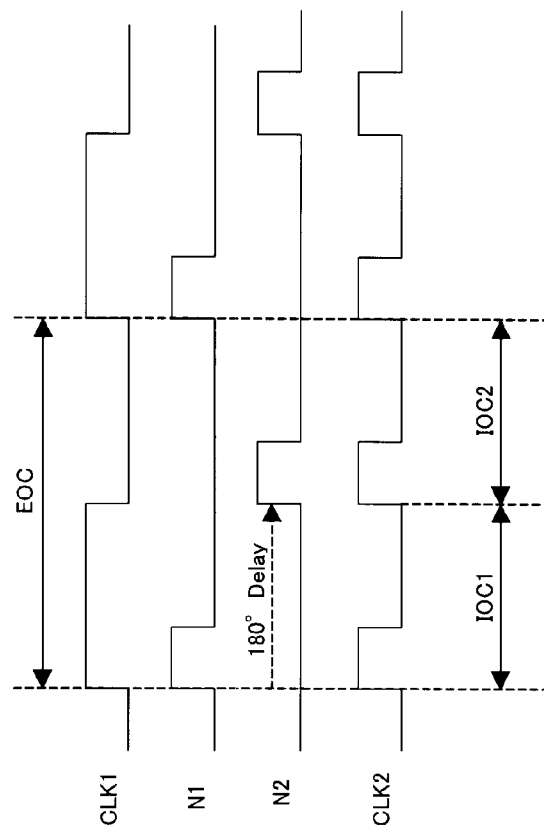

FIG. 13 is a diagram depicting the first circuit example of the clock multiplication circuit and the operation thereof. The clock CLK1, which frequency is the same as the external clock, is supplied to the pulse generation circuit 40, and the pulse signal N1, synchronizing with the rise edge of the clock CLK1, is generated. The clock multiplication circuit 11 is a DLL (Delay Locked Loop) circuit, which is comprised of the variable delay circuits 41 and 44, the phase comparator 45, which compares phases between the pulse signal N1 and the delayed signal, and a variable delay control circuit, which controls the delay of the variable delay circuits 41 and 44 so as to match the phase of the input signals according to the phase comparison result. Because of this DLL circuit, the variable delay circuits 41 and 44 have the same delay, so the output N2 of the variable delay circuit 41 is a pulse signal which phase is delayed 180 degrees from the phase of the clock CLK1. Then the pulse signal N1 and the pulse signal N2, which is delayed 180 degrees, are combined by the NOR gate 42, and the internal clock CLK2, where frequency has been doubled, is generated.

Figure 14A:
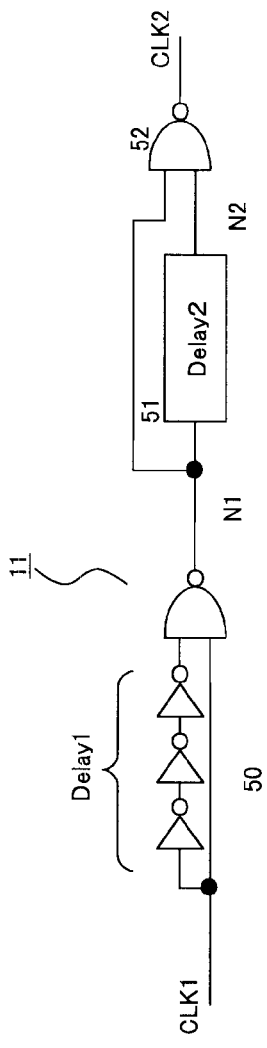
FIGS. 14A and 14B are diagrams depicting a second circuit example and an operation of a clock multiplication circuit.
Figure 14B:
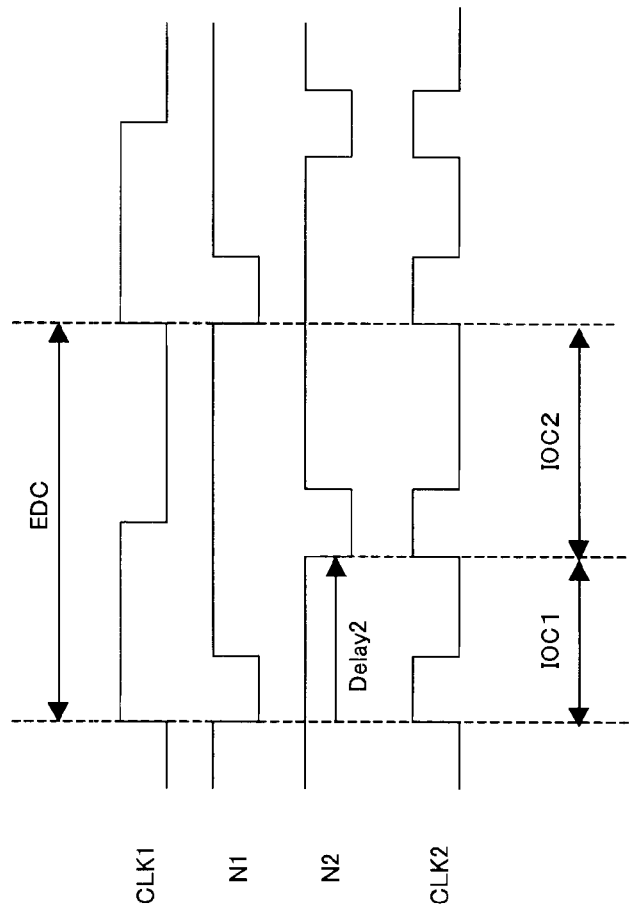

FIG. 14 is diagrams depicting a second circuit example of the clock multiplication circuit and the operation thereof. In this circuit example, the pulse signal N2, which is delayed for a predetermined quantity, is generated by the fixed delay circuit 51 which has a fixed delay quantity with respect to the pulse signal N1, and the pulse signals N1 and N2 are combined by the NAND gate 52 so that 2 internal clocks CLK2 are generated in the external operation cycle EOC. In this case, the length of the first half internal operation cycle IOC1 and the length of the latter half internal operation cycle IOC2 are different, but there are no operation problems if the external operation cycle EOC is set to a length which is double the internal operation cycle IOC1 or longer.

Fifth Embodiment

Figure 16:
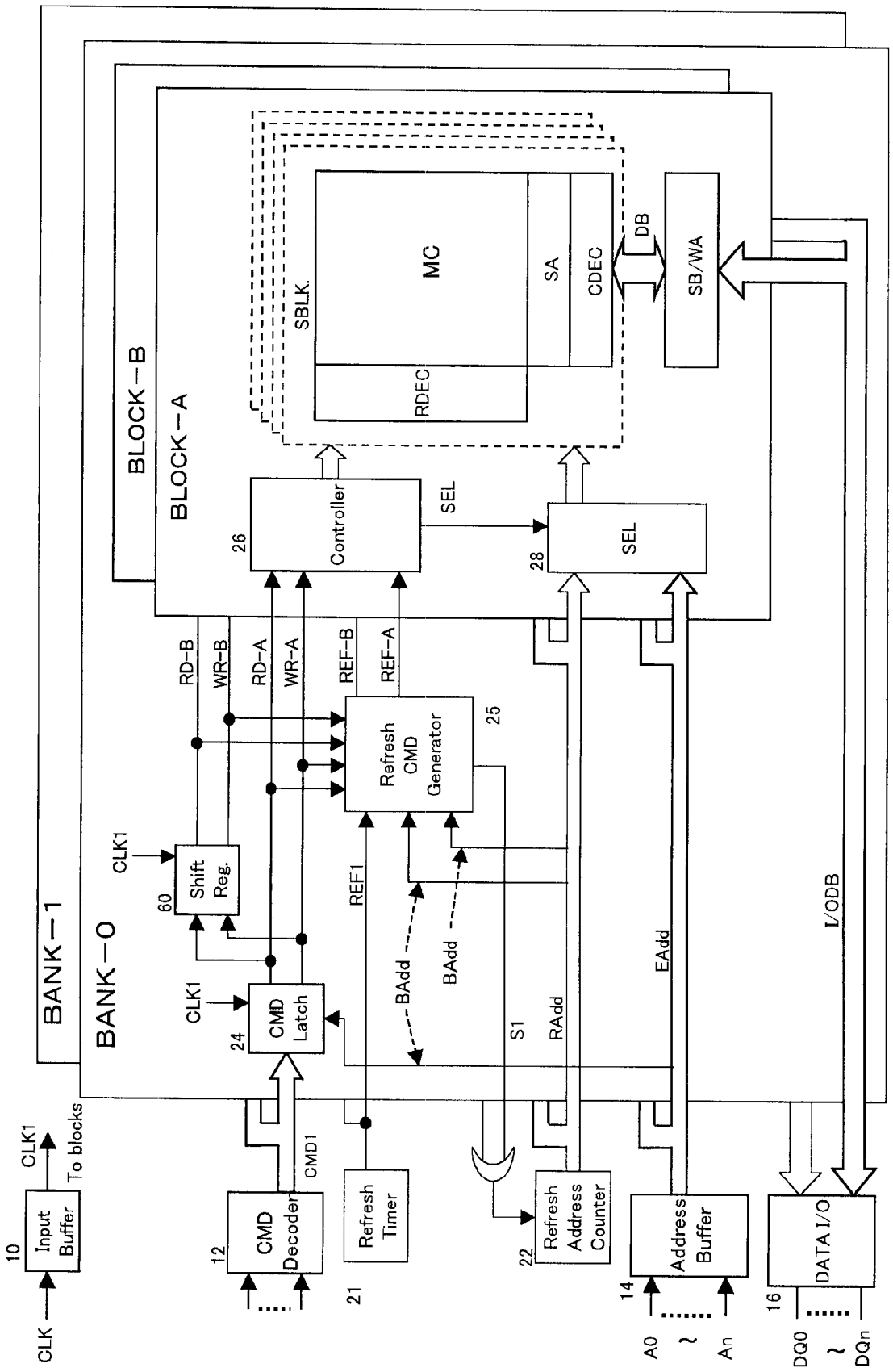
FIG. 16 is a diagram depicting a configuration of a memory circuit in the fifth embodiment.

The fifth embodiment, just like the third embodiment, is a memory circuit where the data transfer rate is improved by inputting/outputting data in burst mode. The operation viewed from outside is the same as the third embodiment, but the implementation method is different. FIG. 15 is a diagram depicting an operation in the fifth embodiment. FIG. 16 is a diagram depicting a configuration of the memory circuit.

As FIG. 16 shows, in the fifth embodiment, the memory banks BANK0 and BANK1, which are the memory core, are comprised of a plurality of blocks, blocks BLOCK-A and BLOCK-B for example. Responding to the operation command supplied from outside, the command latch 24 generates the read signals RD-A and RD-B or the write signals WE-A and WE-B to the blocks A and B. The read and the write commands RD-A and WR-A are input to the control circuit 26 of the block A, as is, from the command latch 24. The commands RD-B and WR-B are input to the control circuit 26 (not illustrated) of the block B, with a 1clock cycle delay, via the shift register 60. Also, in the same way as the above embodiments, 2 cycles of the internal operation cycle IOC of the memory circuit are assigned to 1cycle of the external operation cycle EOC.

When the memory controller, not illustrated, issues the read command READ or the write command WRITE to the memory device at the external operation cycle EOC, the internal read signal RD-A or the write signal WR-A is input to the block BLOCK-A at the first internal operation cycle IOC1, and the internal read signal RD-B or the write signal WR-B is input to the block BLOCK-B at the subsequent second internal operation cycle IOC2.

For one external command, a memory cell is selected from the blocks A and B respectively, the read or write operation for the command is executed in the block A at the internal operation cycle IOC1, and the operation for the command is executed in the block B at the subsequent internal operation cycle IOC2. More specifically, at the internal operation cycle IOC1, the sub-block SBLK selected from the block A is activated, the operation corresponding to the command is executed in the sub-block SBLK, and the same operation is repeated in the block B at the internal operation cycle IOC2.

The memory device has a refresh timer 21 which detects the refresh time, and responding to the refresh timer signal REF1 generated by the refresh timer 21, the refresh command generation circuit 25 automatically generates the refresh commands REF-A and REF-B internally for the block A or B which is selected by the refresh address RAdd generated by the refresh address counter 22. More specifically, the refresh address counter 22 selects a word line of the sub-block SBLK in the block A or B.

As mentioned above, the refresh time is detected by the signal REF1 which is periodically output from the refresh timer 21. Responding to this refresh timer signal REF1, the later mentioned refresh flag signal rises in the refresh command generation circuit 25.

The refresh command generation circuit 25 generates the refresh command REF-A synchronizing with the clock CLK1 when (1) the refresh flag signal is at H level, (2) the blocks BLOCK-A and B select address BAdd is at H level (block A is selected), and (3) the operation command RD-A=WR-A="L".

Also the refresh command generation circuit 25 generates the refresh command REF-B synchronizing with the clock CLK1 when (1) the refresh flag signal is at H level, (2) the blocks BLOCK-A and B select address BAdd is at L level (block B is selected), and (3) the operation command RD-B=WR-B="L".

The control circuit 26 in each block executes the refresh operation in the block BLOCK-A (or the block BLOCK-B) based on the refresh command REF-A (or REF-B). Specifically, the refresh operation is executed for the selected sub-block SBLK in the blocks BLOCK-A or B.

As FIG. 15 shows, in the fifth embodiment, responding to the read command READ-a supplied at time t0, the read operation READ-Aa is executed for the sub-block SBLK in the block BLOCK-A, and the read operation READ-Bb is executed for the sub-block SBLK in the block BLPK-B at the first internal operation cycle IOC1. The respective read data QAa and QBa are output from the input/output terminal DQ at the subsequent internal operation cycle.

Then the internal refresh operation REF-A is executed for the sub-block SBLK in the block BLOCK-A during the second internal operation cycle IOC2. This is because during this cycle IOC2, the read operation is not executed in the block BLOCK-A.

In FIG. 15, responding to the read command READ-b supplied at time t2, the read operation is executed in the blocks BLOCK-A and BLOCK-A at the first and second internal operation cycles IOC1 and IOC2 respectively, as mentioned above. Then at time t4, the write command is not supplied since burst mode is used, but the write command WRITE-c is supplied at time t6, and responding to this, the write data DAc is written to a cell in the sub-block SBLC in the block BLOCK-A at the first internal operation cycle IOC1. Also at the second internal operation cycle IOC2, the write data DBc is written to a cell in the sub-block SBLK in the block BLOCK-B. In this case, the internal refresh REF-B is executed for the sub-block SBLK in the block BLOCK-B at the first internal operation cycle IOC1 at time t6.

In the configuration example in FIG. 16, the sub-blocks SBLK of the blocks BLOCK-A and BLOCK-B are independently configured from each other, but the sub-blocks SBLK of the blocks BLOCK-A and BLOCK-B may be physically integrated only if they are logically separated by addresses.

Figure 17:
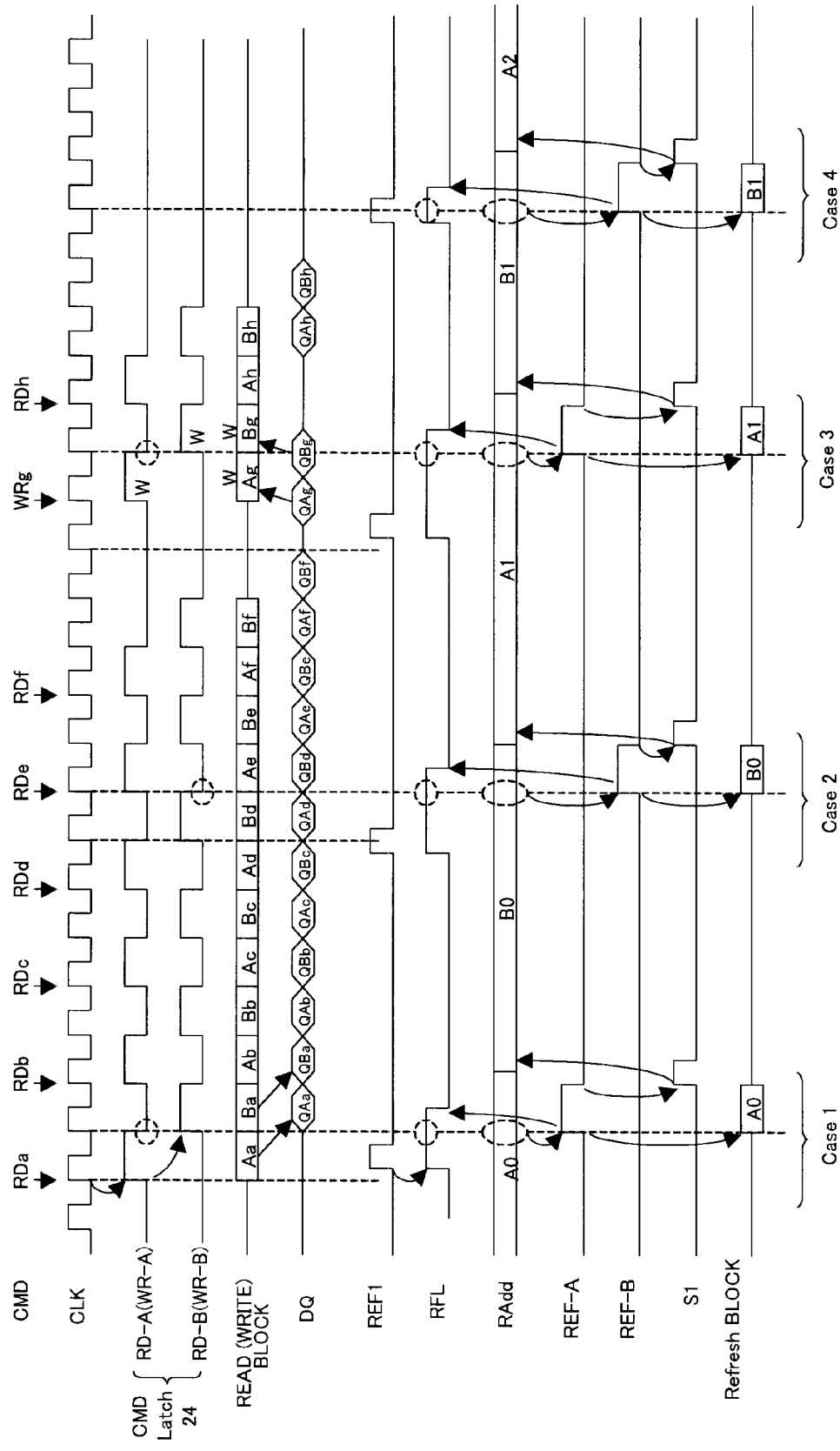
FIG. 17 is a timing chart depicting an internal operation in the fifth embodiment.

FIG. 17 is a timing chart depicting an internal operation of the memory cell in the fifth embodiment. In this example, the fresh address counter 22 alternately selects the block BLOCK-A and BLOCK-B.

In case 1, responding to the read command RDa, the refresh A0 is executed in the block BLOCK-A at the internal operation cycle IOC2 at the same time with reading Ba at the block BLOCK-B. In other words, when the refresh timer signal REF1 is generated during read operation Aa in block BLOCK-A, the refresh is executed in the block A during the next internal operation cycle after the reading operation in block A ends.

In case 2, responding to the read command RDe, the refresh R0 is executed in the block BLOCK-B at the internal operation cycle IOC1 at the same time with reading Ae from the block BLOCK-A. In other words, when the timing of the refresh comes during the read operation Bd in the block B responding to the read command RDd, the refresh operation in. the block B is executed at the first internal operation cycle in the next external operation cycle.

Case 3 is when the write operation and the refresh timing overlap, where responding to the write command WRg, the refresh A1 is executed in the block BLOCK-A at the internal operation cycle IOC2 at the same time with writing Bg in the block BLOCK-B.

Case 4 is when the external command and the refresh timing do not overlap, and in this case, the refresh operation is executed during one of the internal operation cycles responding to the refresh timing since none of the read signals RD-A and RD-B and the write signals WR-A and WR-B, which are output from the command latch 24, are at H level.

In the example in FIG. 17, the refresh address RAdd is the address of the block A and that of block B alternately, but this is not always the case. The address of the block B maybe generated after continuously generating the address of the block A, or the address of the block B may be continuously generated after the address of the block A is continuously generated. In the above mentioned case 3, if the refresh address RAdd is the address of the block B, the refresh is executed in the block B during the write operation Ag of the block A which responds to the write command WRg.

Figure 18:
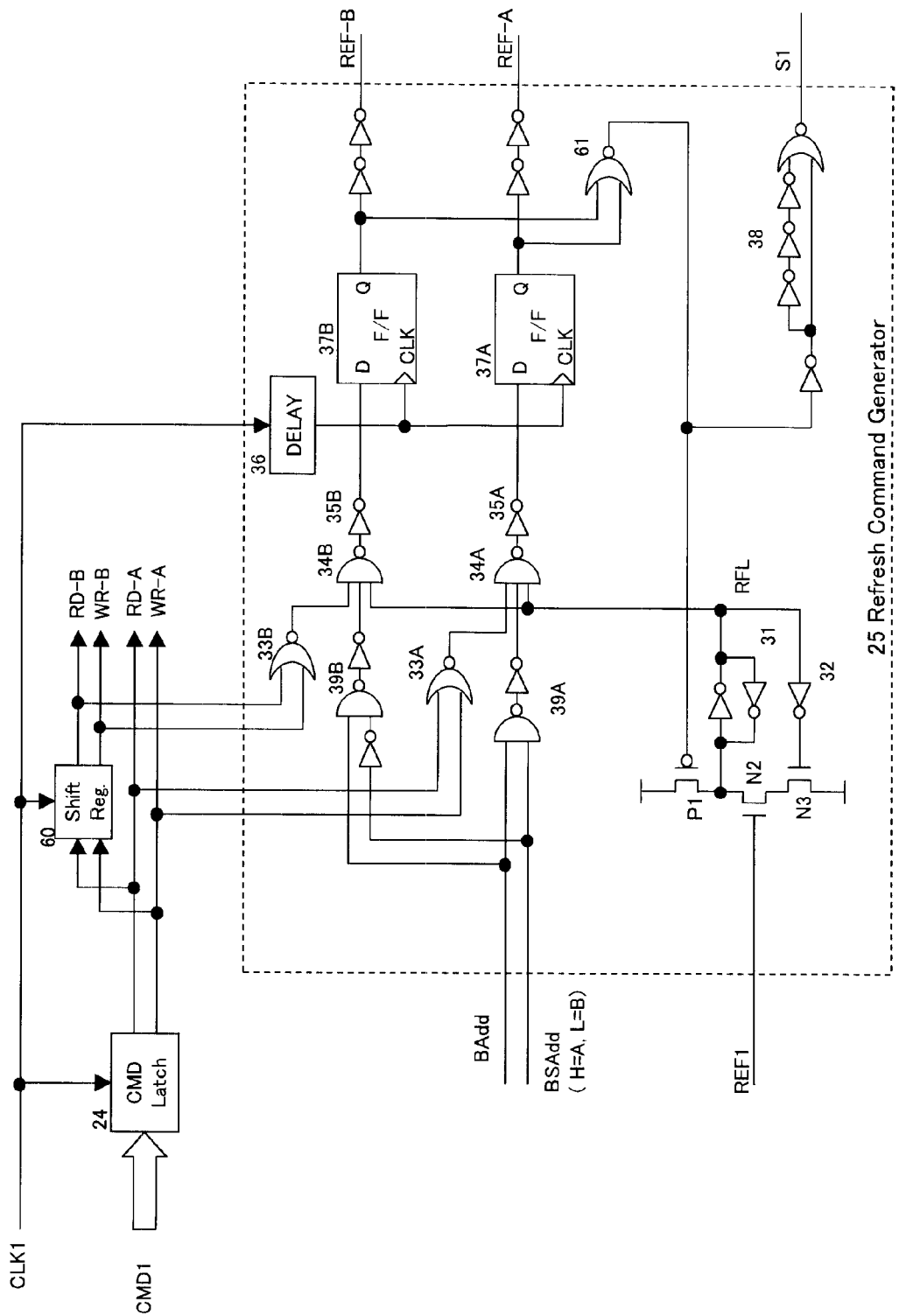
FIG. 18 is a circuit diagram depicting a refresh command generation circuit in the fifth embodiment.

FIG. 18 is a diagram depicting an example of the refresh command generation circuit in the fifth embodiment. In this circuit configuration, the part of the gates 33, 34 and 35 and the flip-flop 37 for generating the internal refresh command shown in FIG. 5 is duplicated to generate the 2 internal refresh commands REF-A and REF-B. And in each circuit, the select function to select the block BLOCK-A or B is added. In FIG. 18 therefore, A and B are added to the reference numbers of the circuits in this duplicated configuration.

To the refresh command generation circuit 25, the blocks A/B select address BSAdd is supplied in addition to the bank select address BAdd, and the block is selected by the gate 39A and the gate 39B. The flip-flop 37A latches H level synchronizing with the clock CLK1, and generates the refresh command REF-A when (1) the refresh flag signal RFL is at H level (2) the block select address BSAdd is at H level (block A is selected) and (3) the operation command RD-A=WR-A="L".

Also the flip-flop 37B latches H level synchronizing with the clock CLK1 and generates the refresh command REF-B when (1) the refresh flag signal RFL is at H level (2) the block select address BSAdd is at L level (block B is selected) and (3) the operation command RD-B=WR-B="L".

In the fifth embodiment, data is read or written in burst mode, just like the third embodiment, but the number of data to read from (or to write to) the memory cell array MC in each block at one time is less than the third embodiment, so the number of input/output data buses I/ODB can be decreased.

In other words, in the third embodiment, data (e.g. 32 bits) read in parallel during one clock cycle for the read command READ from outside, for example, is output in serial during 2 clocks as 2 half data (e.g. 16 bits ×2 clocks). While in the fifth embodiment, data read during 1 clock cycle (e.g. 16 bits) is output (e.g. 16 bits) at the next 1 clock cycle, and this operation is continuously performed in the blocks A and B within 2 clock cycles (within 2 internal operation cycles). Therefore in the third embodiment where data for 2 clocks is read in parallel from the memory core during 1 clock, the number of input/output data buses I/ODB is double that of the fifth embodiment. As a consequence, the fifth embodiment is advantageous in terms of chip area.

Sixth Embodiment

In the fifth embodiment, the block in the memory core (bank) is comprised of 2 blocks, BLOCK-A and B, so that 2-bit burst data can be input and output by operating both blocks for one operation command. In the sixth embodiment, on the other hand, the block in the memory core (bank) is comprised for 4 blocks, BLOCK-A, B, C and D, so that 4-bit burst data can be input/output. In the sixth embodiment, 4 internal operation cycles are included in one external operation cycle so as to enable a 4-bit burst length. Among the 4 internal operation cycles, the refresh operation is executed at a memory block where an operation corresponding to the operation command is not executed.

Figure 19:
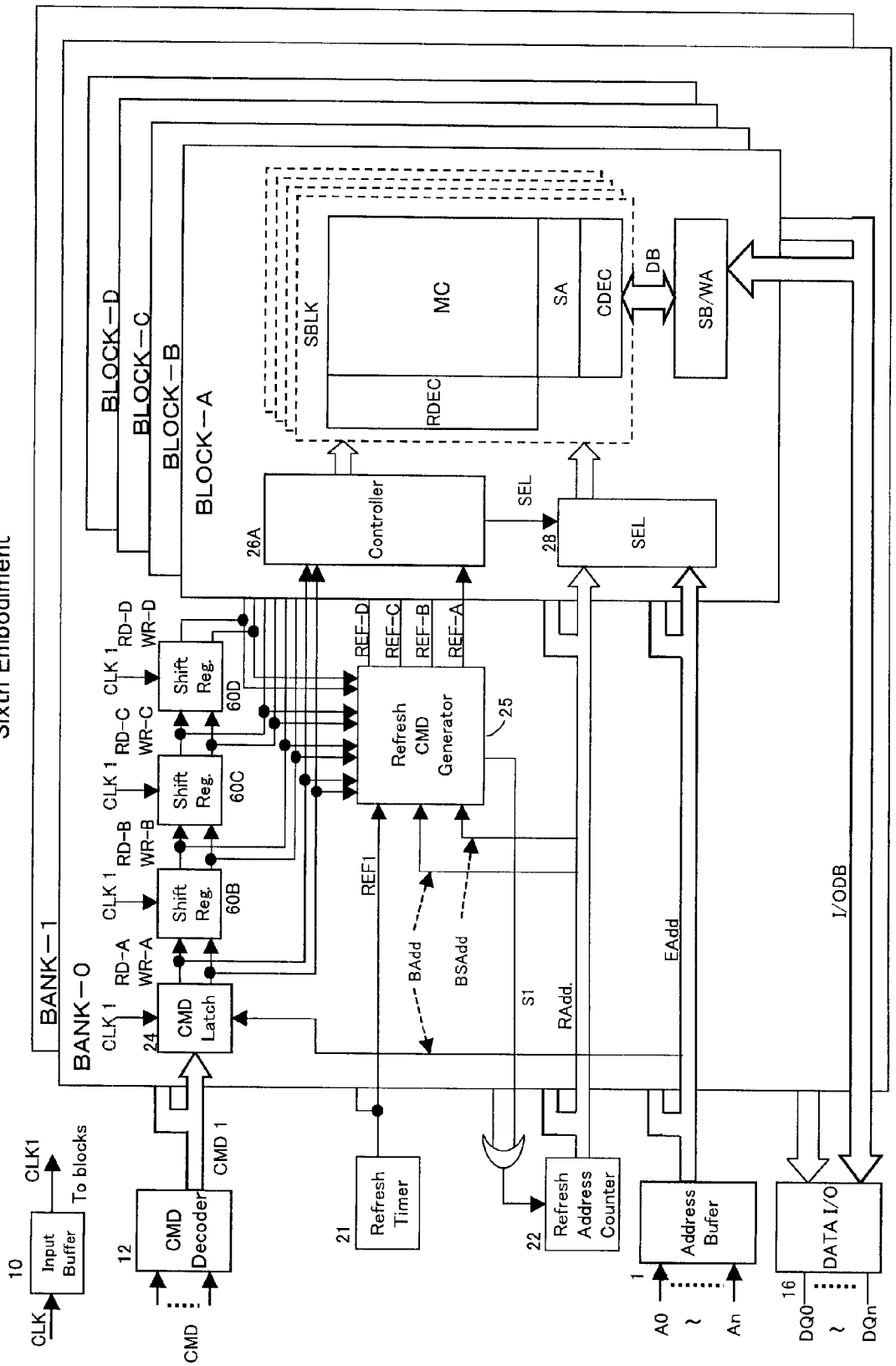
FIG. 19 is a diagram depicting a configuration of a memory circuit in the sixth embodiment.
Figure 20:
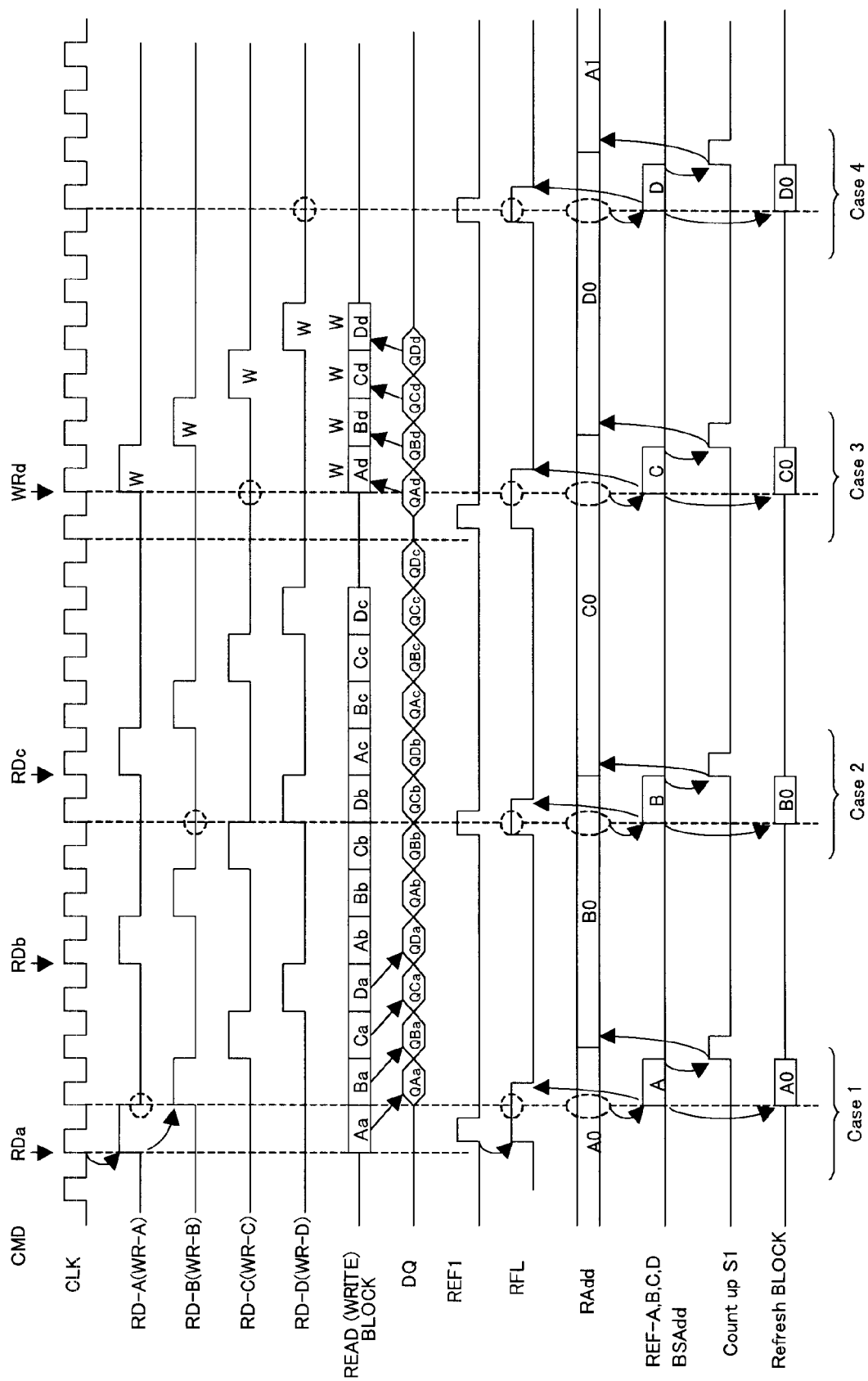
FIG. 20 is a timing chart depicting an internal operation in the sixth embodiment.
Figure 21:
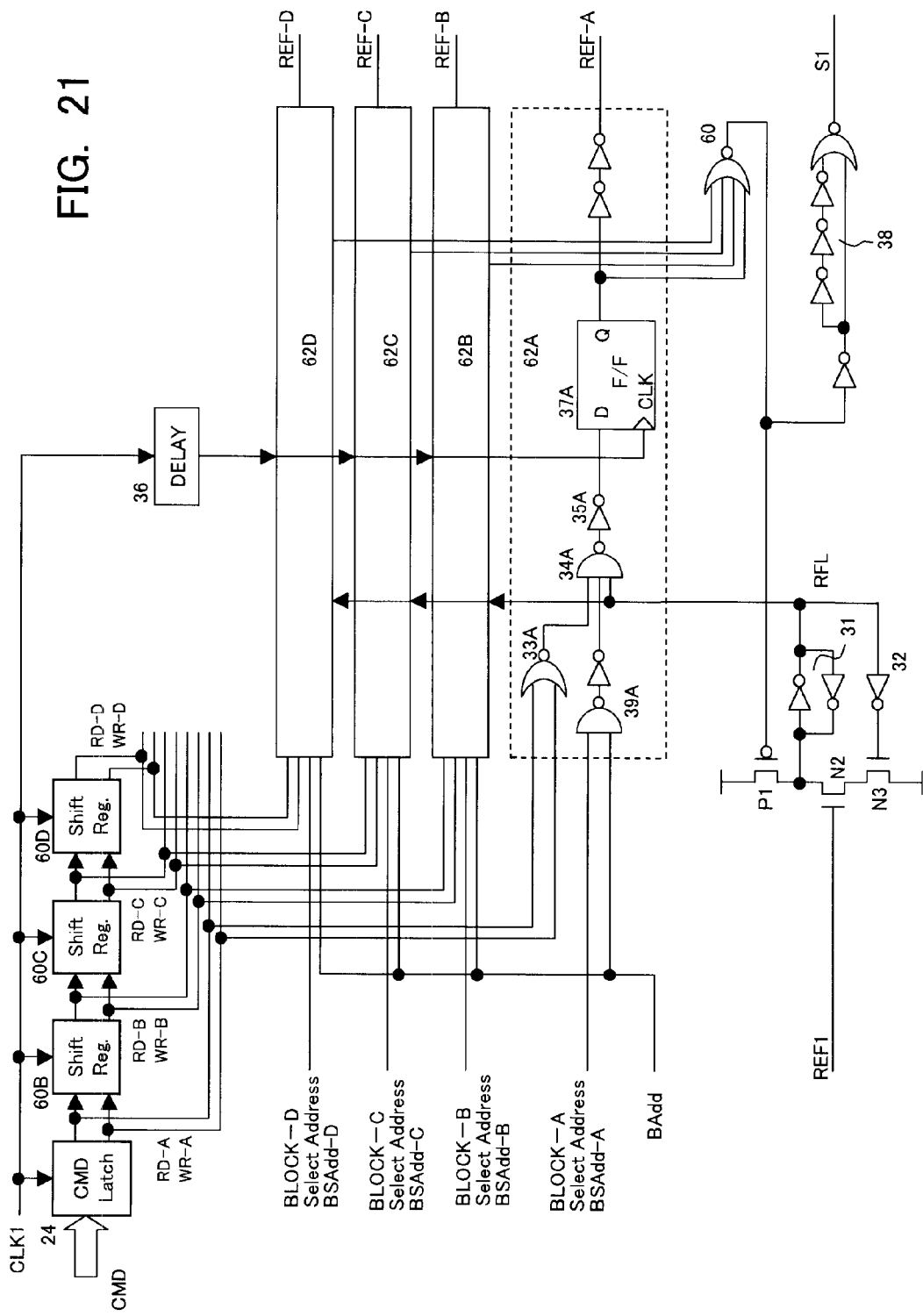
FIG. 21 is a circuit diagram of a refresh command generation circuit in the seventh embodiment.

FIG. 19 is a diagram depicting a configuration of a memory circuit in the sixth embodiment. FIG. 20 is a timing chart depicting the internal operation thereof. FIG. 21 is a diagram depicting an example of the refresh command generation circuit to be applied to the sixth embodiment.

As FIG. 19 shows, 4 memory blocks, BLOCK-A, B, C and D, which are logically isolated, are provided in the memory bank (memory core) BANK-0, and each block comprises a plurality of sub-blocks SBLK, a control circuit 26A, a selector 28, and a sense buffer/write amplifier SB/WA. Responding to one operation command, the command latch 24 in the bank generates a read signal RD-A or a write signal WR-A when its own bank is selected.

In the subsequent stage of the command latch 24, 3 shift registers, 60B, 60C and 60D, are connected in series, and the above mentioned command signals RD-A, B, C and D and WR-A, B, C and D are sequentially sent to the blocks BLOCK-A, B, C and D with a delay of 1 clock CLK1 each, as FIG. 20 shows. Responding to these command signals, each block executes the read operation or the write operation sequentially during the 4 internal operation cycles after the supply of the external operation command (e.g. RDa). After the read operation in each block, the respective read data (e.g. QAa, QBa, QCa, QDa) is sequentially output from the input/output terminal DQ. Therefore for the read command RD, the external command cycle is supplied 4 clock cycles and the write command WRg is supplied at 6 clock cycles later after the read command RDc is supplied.

The difference of the refresh command generation circuit 25 in FIG. 21 from the circuit in FIG. 18 is that the circuit blocks 62A, B, C and D are disposed to generate 4 internal refresh commands, REF-A, B, C and D. Each circuit block 62 generates the internal refresh commands REF-A, B, C and D for the block to be refreshed by the bank select address BAdd and the block select address BCAdd. The generation conditions of the internal refresh commands REF-A, B, C and D are the same as the case of FIG. 18, where the bank select address BAdd selects its own bank (H level), the block select address BSAdd is at H level, and both the operation command signals RD and WR for the self block are at L level.

As the timing chart in FIG. 20 shows, case 1 is an example when the refresh timing for the block A and the read operation (Aa) in the block A overlap, where the refresh A0 is executed at the second internal operation cycle after the read operation Aa ends. Case 2 is an example when the refresh timing for the block B and the read operation Cb in the blocks C and D overlap, where the refresh B0 is executed at the fourth internal operation cycle after the read operation Cb ends. Case 3 is also the same. Case 4 is an example when the refresh timing for the block D is generated when an internal operation is not executed, and in this case, the refresh DO is executed immediately at the next internal operation cycle.

In the sixth embodiment as well, the number of buses in each input/output data bus I/ODB can be small, just like the fifth embodiment.

Seventh Embodiment

Figure 22:
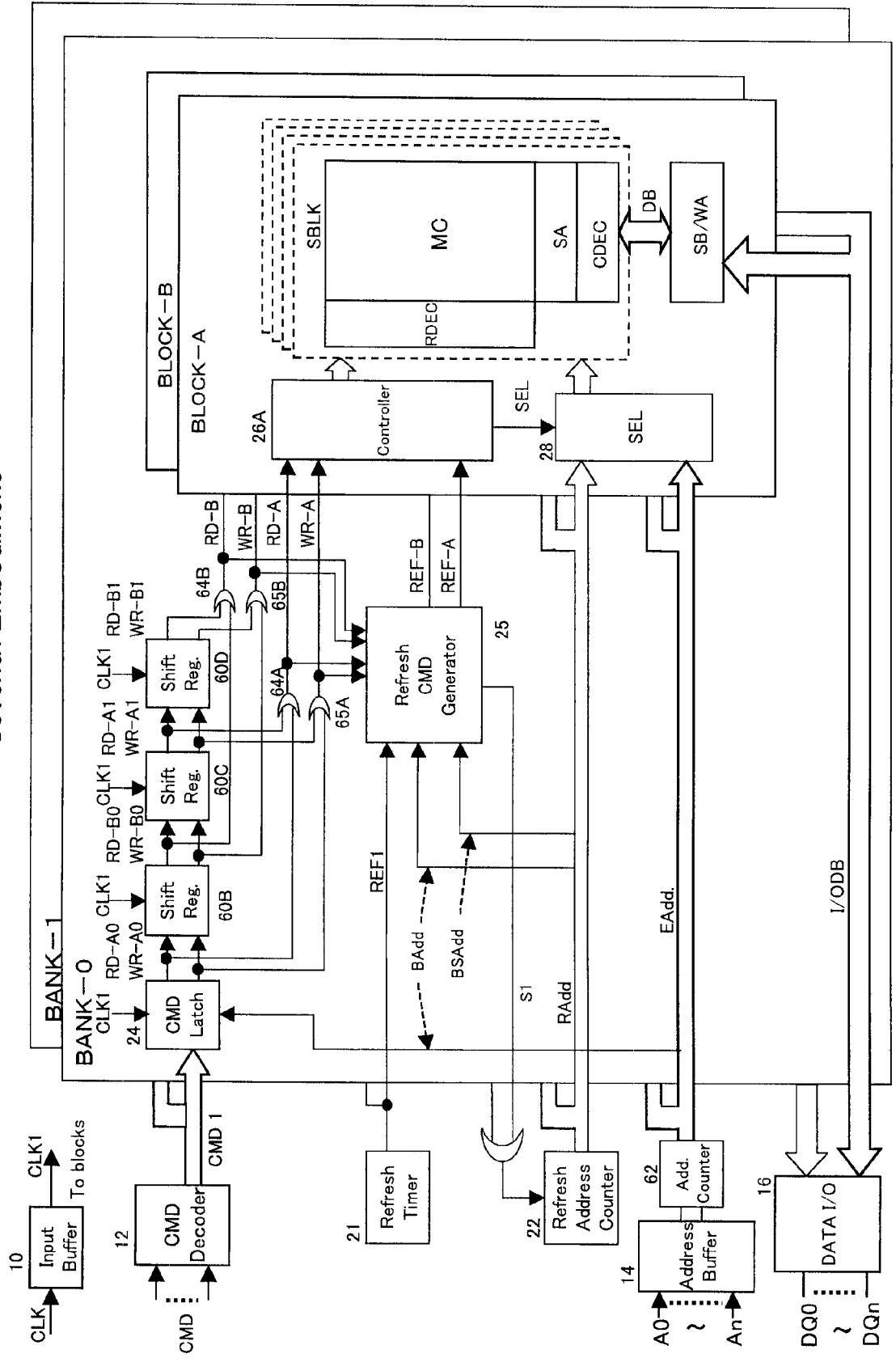
FIG. 22 is a diagram depicting a configuration of a memory circuit in the seventh embodiment.
Figure 23:
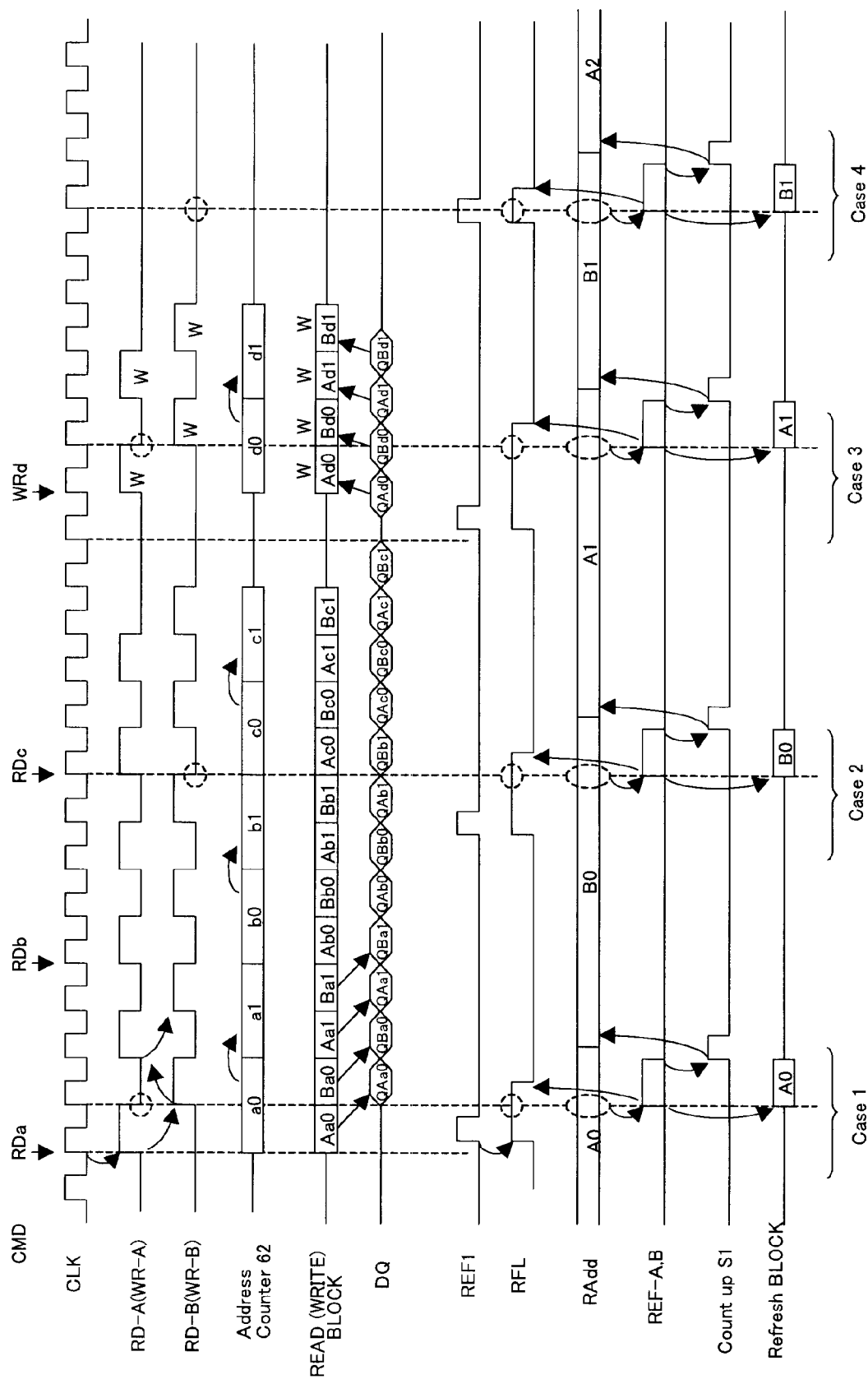
FIG. 23 is a timing chart depicting an internal operation in the seventh embodiment.

The seventh embodiment is another example of input/outputting 4-bit burst mode. FIG. 22 is a diagram depicting a configuration of a memory circuit in the seventh embodiment. FIG. 23 is a timing chart depicting an internal operation thereof.

As FIG. 22 shows, in this embodiment, 2 blocks, BLOCK-A and B, which are logically separated, are disposed in the bank, which is a memory core, and operation corresponding to BLOCK-A →BLOCK-B →BLOCK-A →BLOCK-B is repeated for 1 command so as to implement a 4-bit burst mode. The memory cell to be selected is different between the operation in the block BLOCK-A at the first time and the operation in the block BLOCK-A at the second time. For this, the address counter 62 to increment the address in the block is disposed in a subsequent stage of the address buffer 14.

The operation command signals RD-A and B and WR-A and B for the 2 blocks in the bank delay the operation command signals RD-A0 and WR-A0 generated by the command latch 24 for 1 clock cycle each using the 3 shift registers 60B, C and D, and are supplied via the NOR gates 64 and 65. Responding to the supplied operation commands RD-A and B and WR-A and B, the control circuit 26A in the block executes the corresponding operation in the respective block.

In FIG. 23, when the read command RDa is supplied, the address counter 62 generates the address a0 based on the address signal which is input from outside. On the other hand, responding to the read signal RD-A0 from the command latch 24 and the read signal RD-B0 from the shift register 60B at 1 clock later, a memory cell corresponding to the address a0 is selected in the blocks BLOCK-A and B respectively, and the read operations Aa0 and Ba0 are executed in the sequence of the block BLOCK-A and BLOCK-B. Then the address counter 62 automatically counts up the address a0 and generates the address a1 at 2 clocks later. Responding to the read signal RD-A1 from the shift register 60C and the read signal RD-B1 from the shift register 60D at 1 clock later, a memory cell corresponding to the address a1 is selected in the blocks BLOCK-A and B respectively, and the read operations Aa1 and Ba1 are executed in the sequence of the block BLOCK-A and BLOCK-B. In this way, the 4-bit burst reading ends.

In the seventh embodiment, 2 memory blocks are disposed in the memory core (bank), and responding to an operation command from outside, the 2 memory blocks alternately repeat the corresponding operation. Therefore when an internal operation is executed in one memory block, the refresh operation of the other memory block is executed during the 2 internal operation cycles of the external operation cycle, just like the fifth embodiment.

In this way, in the seventh embodiment, 4 internal operation cycles are included in 1 external operation cycle, so as to enable an operation with 4 bits burst length. And the refresh operation is executed in a block where the internal operation is not executed out of the 4 internal operation cycles.

In case 1 in FIG. 23, the refresh operation A0 for the block A executed while the read operation Ba0 is executed in the block B, since the refresh address RAdd is the address A0 of the block A. In case 2, on the other hand, the refresh operation B0 for the block B is executed while the read operation Ac0 is executed in the block A, since the refresh address RAdd is the address B0 of the block B. In case 3, the refresh operation A1 is executed in the block A while the write operation Bd0 is executed in the block B. In case 4, where no internal operations are executed in any block, the refresh operation B1 is executed in the selected block immediately after refresh timing.

The refresh command generation circuit 25 to be applied to the seventh embodiment is the same as that of the fifth embodiment in FIG. 18.

In the seventh embodiment, 2-bit burst mode or 4-bit burst mode can be executed by controlling the shift registers 60B, C and D. For example, when the burst length is 2 bits, the outputs of the shift registers 60C and 60D are disabled, and when the burst length is 4 bits, the outputs are enabled. If the number of the shift registers is 7, then an 8-bit burst length can be supported. When the burst length is 2, the operation is executed once each in the blocks A and B, when the burst length is 4, the operation is executed twice each in the blocks A and B, and when the burst length is 8, the operation is executed 4 times each in the blocks A and B.

In some of the embodiments, 2 internal operation cycles are assigned to 1 external operation cycle. The present invention, however, is not limited to this, and as another embodiment shows, a plurality of internal operation cycles may be assigned to 1 external operation cycle so that refresh is executed during an internal operation cycle where an internal operation corresponding to a command is not executed in the memory core.

Also in the seventh embodiment, the number of blocks in the memory core is not limited to 2, but may be any number. In this case, a predetermined operation is sequentially executed synchronizing with the internal operation cycle for the plurality of blocks.

Also in the above embodiments, refresh is executed during a predetermined internal operation cycle responding to the internally generated refresh timer signal both in normal operation mode and in power down mode.

According to the above invention, the outside memory controller need not manage the refresh operation of the dynamic memory circuit. Since responding to the refresh timing generated inside the memory circuit, refresh is executed during an internal operation cycle when the internal operation corresponding to an external command is not executed, the memory controller can issue an operation command at any timing without considering refresh timing.

The protective scope of the present invention is not limited by the above embodiments, but cover the invention stated in the claims and equivalents thereof.

What is claimed:

1. A dynamic memory circuit which has volatile memory cells and performs a refresh operation at a predetermined timing, comprising:

a memory core having said memory cells; and
   a refresh command generation circuit which generates a refresh command responding to a refresh signal generated at a predetermined timing, wherein
      a first and second internal operation cycles are assigned to one external operation cycle according to the operation commands including a read command and a write command,
      said memory core, responding to said read command, performs a read operation responding to said read command at said first internal operation cycle, and performs a refresh operation responding to said refresh command at said subsequent second internal operation cycle, and
      said memory core, responding to said write command, performs a refresh operation responding to said refresh command at said first internal operation cycle, and performs a write operation at said second internal operation cycle.

2. The dynamic memory circuit according to claim 1, wherein when said read command or write command is not input, said memory core performs said refresh operation at the earlier cycle of said first or second internal operation cycle responding to said refresh command.

3. The dynamic memory circuit according to claim 1, wherein in said second internal operation cycle responding to said read command, said memory core performs said refresh operation when said refresh command is generated, and does not perform said refresh operation when said refresh command is not generated.

4. The dynamic memory circuit according to claim 1, further comprising an input/output terminal where data is input or output, wherein a plurality of bits of read data is output in serial from said input/output terminal after a read operation in said first internal operation cycle, and a write operation is performed at said second internal operation cycle for the plurality of bits of write data which is input in serial from said input/output terminal.

5. A dynamic memory circuit which has volatile memory cells and performs a refresh operation at a predetermined timing, comprising:

a memory core having a plurality of memory blocks including said memory cells; and
   a refresh command generation circuit which generates a refresh command responding to a refresh signal generated at a predetermined timing, wherein
      a plurality of internal operation cycles are assigned to one external operation cycle according to an operation command,
      said memory core, responding to the operation command, performs an internal operation corresponding to said operation command in said plurality of memory blocks at each one of said internal operation cycles respectively, and performs said refresh operation corresponding to said refresh command in said memory blocks at an internal operation cycle where a corresponding internal operation is not performed.

6. The dynamic memory circuit according to claim 5, wherein the first memory block of said plurality of memory blocks performs the internal operation corresponding to the operation command at the first internal operation cycle, and performs the refresh operation corresponding to said refresh command at the second internal operation cycle,
   and the second memory block of said plurality of memory block performs the internal operation corresponding to the operation command at said second internal operation cycle, and performs the refresh operation corresponding to said refresh command at said first internal operation cycle.

7. A dynamic memory circuit which has volatile memory cells and performs a refresh operation at a predetermined timing, comprising:

a memory core having a first and second memory blocks which include said memory cells respectively; and
   a refresh command generation circuit which generates a refresh command responding to a refresh signal generated at a predetermined timing, wherein
      2N (N is an integer of 1 or more) internal operation cycles are assigned to one external operation cycle according to an operation command,
      said memory core, responding to the operation command, performs an internal operation corresponding to said operation commands of first and second memory blocks at each one of said 2N internal operation cycles respectively, and performs a refresh operation corresponding to said refresh command in said memory blocks at an internal operation cycle where a corresponding internal operation is not performed.

8. A dynamic memory circuit which has volatile memory cells and performs a refresh operation at a predetermined timing, comprising:

a memory core which has 2M (M is an integer of 1 or more) memory blocks including said memory cells respectively; and
   a refresh command generation circuit which generates a refresh command responding to a refresh signal generated at a predetermined timing, wherein
      2N (N is an integer of 1 or more) internal operation cycles are assigned to one external operation cycle according to an operation command,
      said memory core, responding to the operation command, performs an internal operation corresponding to said operation command of said memory blocks respectively at each one of said 2N internal operation cycles, and performs refresh operation corresponding to said refresh command in said memory blocks at an internal operation cycle where a corresponding operation is not performed.

9. The dynamic memory circuit according to one of claim 1 to claim 8, wherein said memory core further comprises word lines, bit lines crossing said word lines, a sense amplifier to be connected to said bit lines, and said memory cells in association to said word lines and bit lines, and said memory core activates said word line and sense amplifier then precharges said bit lines within said internal operation cycle, responding to said operation command.

* * * * *